United States Patent
Huang et al.

(10) Patent No.: US 10,108,095 B2
(45) Date of Patent: Oct. 23, 2018

(54) AUTOMATED MASK STORAGE AND RETRIEVAL SYSTEM

(71) Applicant: Taiwan Semiconductor Manufacturing Co., Ltd., Hsin-Chu (TW)

(72) Inventors: Chun-Jung Huang, Yunlin County (TW); Chien-Fa Lee, Hsinchu (TW); Yiang-Luen Lin, Hsin-Chu (TW); Sam Chin, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 164 days.

(21) Appl. No.: 15/168,424

(22) Filed: May 31, 2016

(65) Prior Publication Data

US 2017/0343906 A1 Nov. 30, 2017

(51) Int. Cl.
*G03F 7/20* (2006.01)
*G06K 7/10* (2006.01)
*G06K 7/14* (2006.01)

(52) U.S. Cl.
CPC ..... *G03F 7/70741* (2013.01); *G06K 7/10366* (2013.01); *G06K 7/1413* (2013.01)

(58) Field of Classification Search
USPC ...................................................... 700/218
See application file for complete search history.

(56) References Cited

U.S. PATENT DOCUMENTS

| | | | |
|---|---|---|---|
| 6,778,879 B2 | 8/2004 | Chang et al. |
| 6,871,115 B2 | 3/2005 | Huang et al. |
| 6,996,448 B2 | 2/2006 | Huang et al. |
| 7,508,145 B2 | 3/2009 | Bourke et al. |
| 7,679,722 B2 | 3/2010 | Chen et al. |
| 7,780,392 B2 | 8/2010 | Rogers et al. |
| 7,829,838 B2 | 11/2010 | Haubenschild et al. |
| 7,966,090 B2 | 6/2011 | Wang et al. |
| 8,492,283 B2 | 7/2013 | Chen et al. |
| 8,616,821 B2 | 12/2013 | Ku et al. |
| 8,628,897 B1 | 1/2014 | Lu et al. |
| 8,679,707 B2 | 3/2014 | Lee et al. |
| 8,691,476 B2 | 4/2014 | Yu et al. |
| 8,709,682 B2 | 4/2014 | Chen et al. |
| 8,715,890 B2 | 5/2014 | Tu et al. |
| 8,722,286 B2 | 5/2014 | Yu et al. |
| 8,753,788 B1 | 6/2014 | Yu et al. |

(Continued)

*Primary Examiner* — Kyle O Logan
(74) *Attorney, Agent, or Firm* — Haynes and Boone, LLP

(57) ABSTRACT

An automated photomask storage and retrieval system includes a plurality of mobile storage units aligned in a first direction. Each mobile storage unit is movable in the first direction and includes a plurality of storage cells. A gantry is disposed over the plurality of mobile storage units. The gantry includes a supporting frame movable in the first direction. The plurality of mobile storage units interpose a pair of supporting members of the supporting frame. A beam connects the pair of supporting members and is movable along the pair of supporting members in a second direction perpendicular to the first direction. The beam includes a plurality of buffer cells. A robotic arm is disposed adjacent to the plurality of buffer cells and movable along the beam. The robotic arm is configured to transfer a container containing a photomask between a storage cell and a buffer cell.

20 Claims, 24 Drawing Sheets

(56) References Cited

U.S. PATENT DOCUMENTS

| | | |
|---|---|---|
| 8,764,995 B2 | 7/2014 | Chang et al. |
| 8,765,330 B2 | 7/2014 | Shih et al. |
| 8,765,582 B2 | 7/2014 | Hsu et al. |
| 8,785,084 B2 | 7/2014 | Lu et al. |
| 8,823,951 B2 | 9/2014 | Mimeault et al. |
| 8,828,625 B2 | 9/2014 | Lu et al. |
| 8,841,047 B2 | 9/2014 | Yu et al. |
| 8,877,409 B2 | 11/2014 | Hsu et al. |
| 9,020,633 B1 * | 4/2015 | Chen ................ H01L 21/67769 700/213 |
| 2003/0067253 A1 | 4/2003 | Kuo |
| 2003/0069857 A1 | 4/2003 | Junda |
| 2009/0053017 A1 * | 2/2009 | Shmuelov ......... H01L 21/67017 414/217 |
| 2010/0138016 A1 | 6/2010 | Chen et al. |
| 2013/0202992 A1 | 8/2013 | Chen et al. |
| 2015/0131070 A1 * | 5/2015 | Tung .................. G03F 7/70741 355/72 |
| 2015/0286146 A1 | 10/2015 | Chang et al. |
| 2015/0309405 A1 | 10/2015 | Shih et al. |
| 2015/0311075 A1 | 10/2015 | Huang et al. |

* cited by examiner

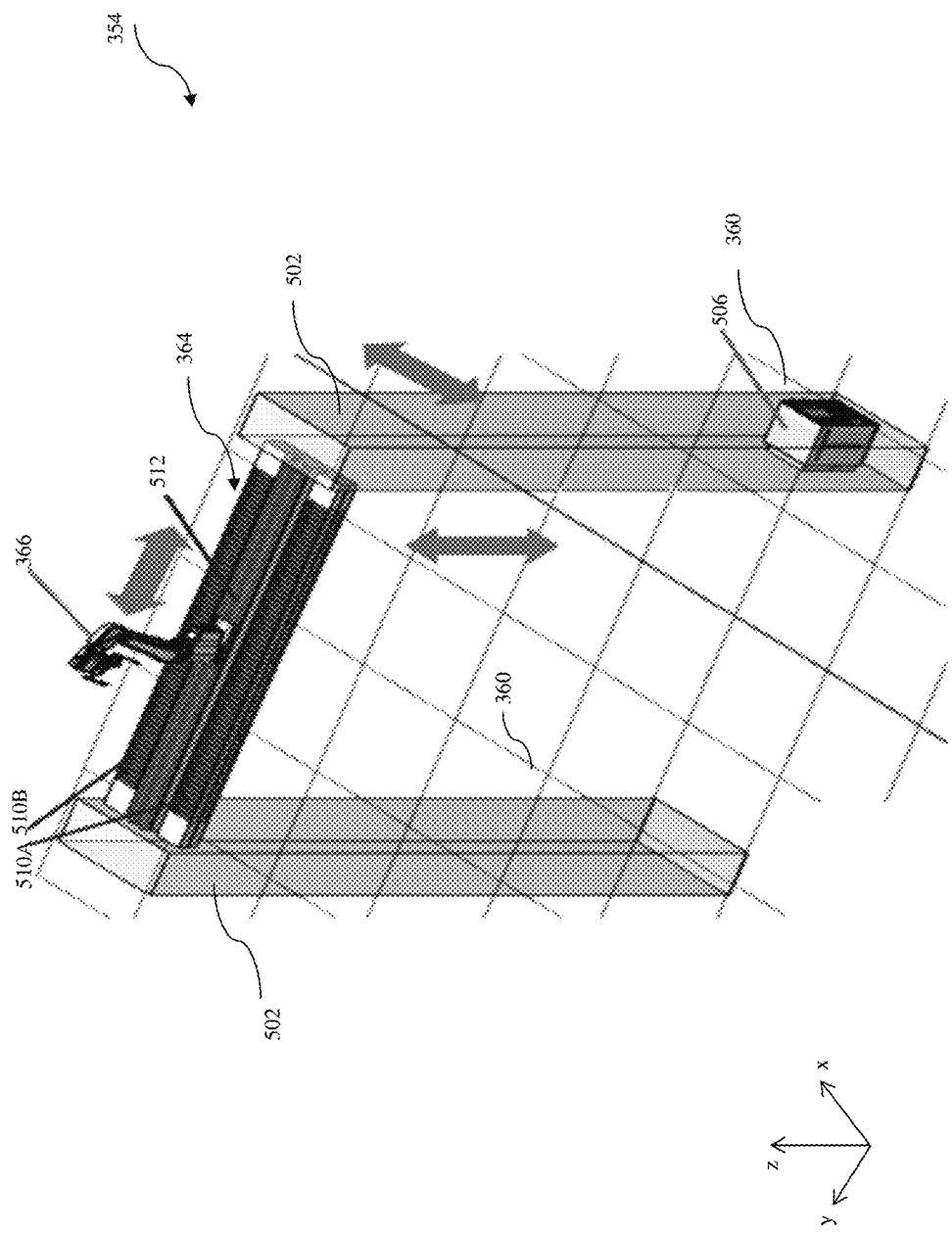

| Mask Transfer Request Table 800 | | | |
|---|---|---|---|
| Mask Transfer Request | Tool | Mask Identifier | Transfer Type |
| Mask Transfer Request 802 | Lithography Tool 204 | M1 | Retrieve a mask from the mask storage system |
| Mask Transfer Request 804 | Lithography Tool 206 | M2 | Store a mask in the mask storage system |
| Mask Transfer Request 806 | Mask Repair Tool 208 | M3 | Store a mask in the mask storage system |
| Mask Transfer Request 808 | Mask Repair Tool 210 | M4 | Retrieve a mask from the mask storage system |

FIG. 8

Mask Storage System Access Information 900

| Mask Transfer Request | Mask Identifier | Transfer Type | Storage Cell Information ||||| Access Step of Access Route |
|---|---|---|---|---|---|---|---|
| | | | Storage Cell Identifier | Storage Unit Side | Column | Row | |
| Mask Transfer Request 802 ← 914 | M1 | Retrieve | S1 | 308A | 4 | 2 | 4 |
| Mask Transfer Request 804 ← 916 | M2 | Store | S2 | 330B | 2 | 4 | 1 |
| Mask Transfer Request 806 ← 918 | M3 | Store | S3 | 322A | 5 | 5 | 3 |
| Mask Transfer Request 808 ← 920 | M4 | Retrieve | S4 | 332A | 2 | 1 | 2 |

Mask Storage System Access Information 900

| Mask Transfer Request Identifier | Mask Identifier | Transfer Type | Storage Cell Information | | | | Access Step of Access Route |
|---|---|---|---|---|---|---|---|
| | | | Storage Cell Identifier | Storage Unit Side | Column | Row | |
| Mask Transfer Request 802 | M1 | Retrieve | S1 | 308A | 4 | 2 | 4 |
| Mask Transfer Request 804 | M2 | Store | ~~S2~~ S5 | 330B | ~~2~~ 1 | ~~4~~ 3 | 1 |
| Mask Transfer Request 806 | M3 | Store | S3 | 322A | 5 | 5 | 3 |
| Mask Transfer Request 808 | M4 | Retrieve | S4 | 332A | 2 | 1 | 2 |

FIG. 13

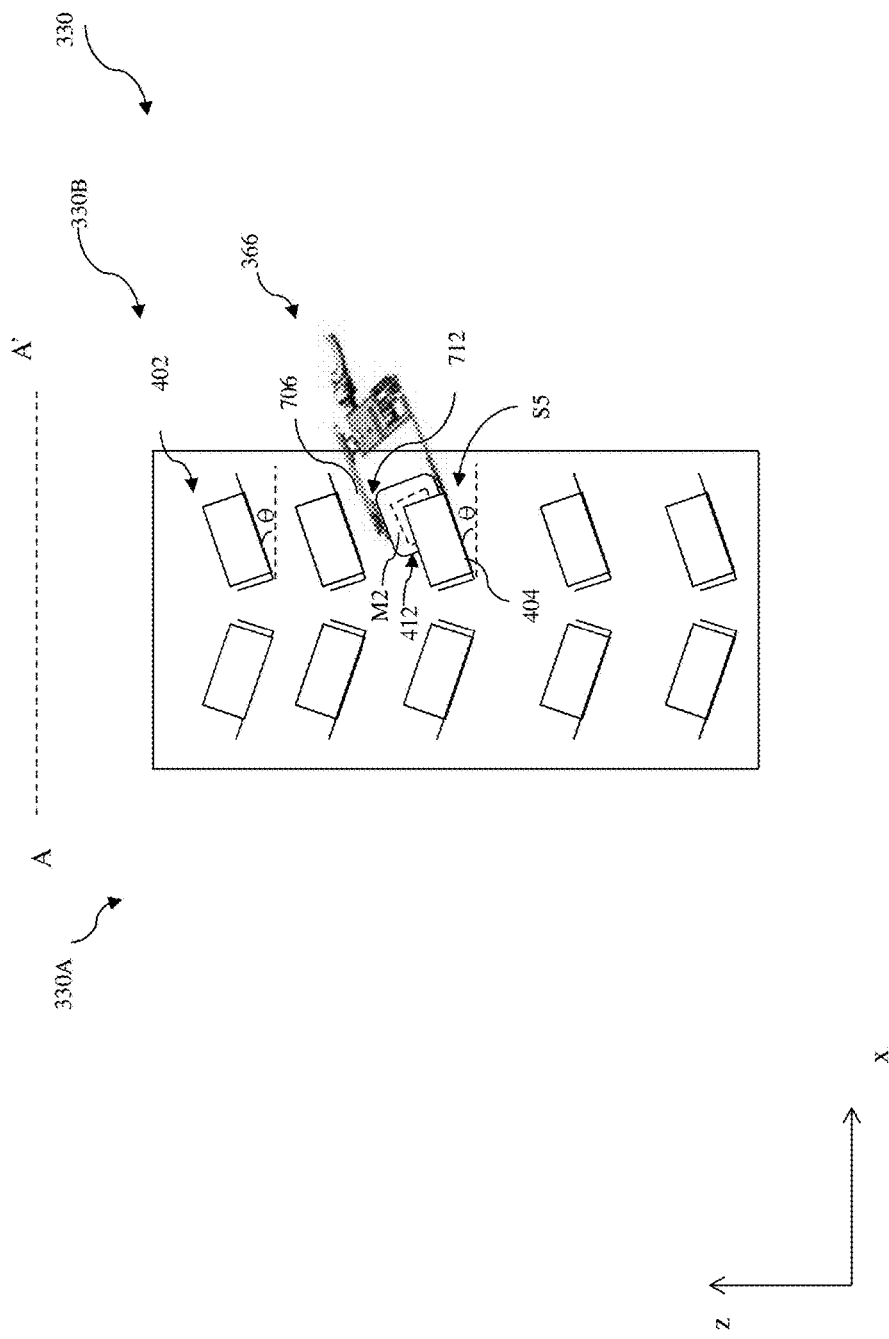

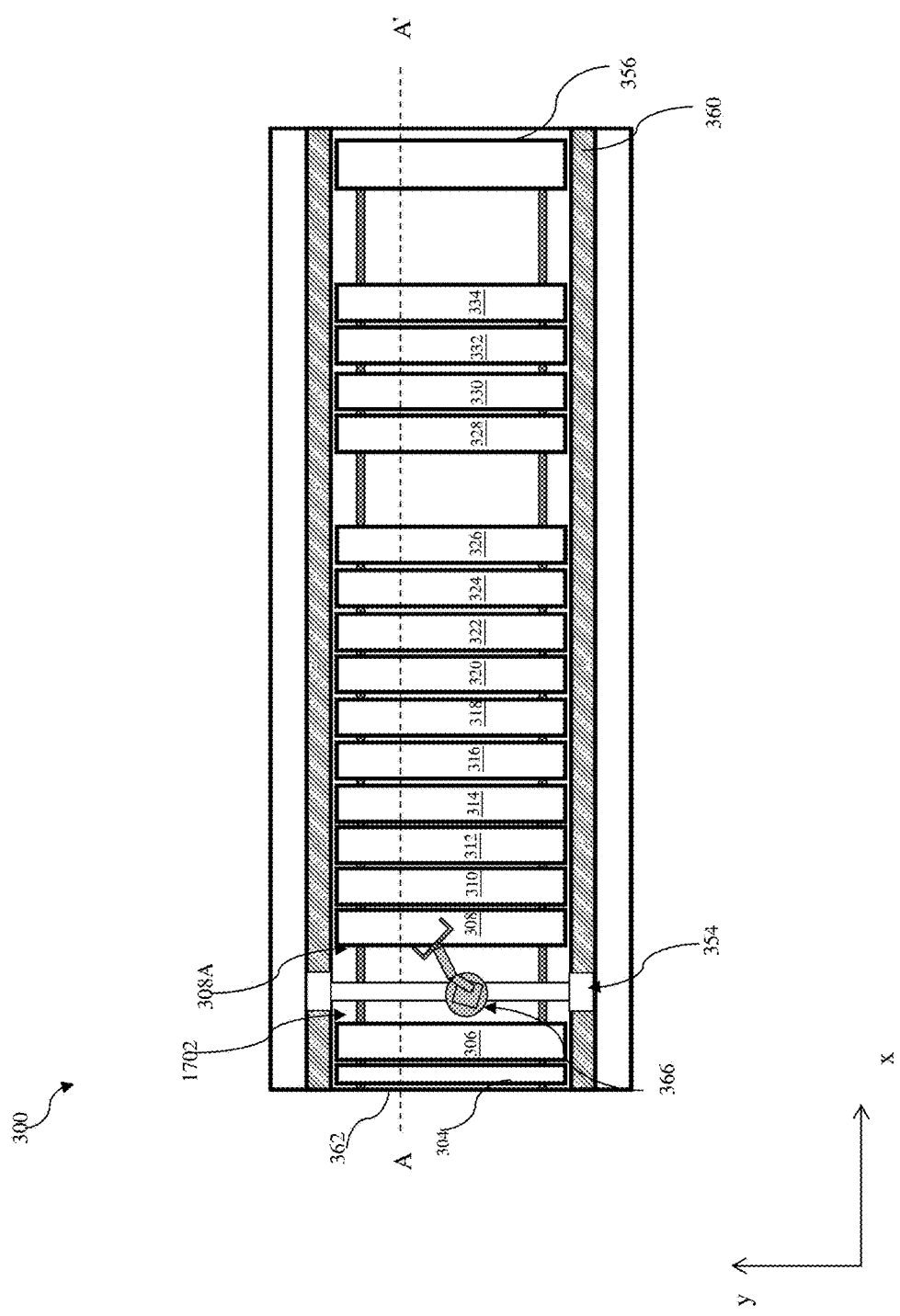

AUTOMATED MASK STORAGE AND RETRIEVAL SYSTEM

BACKGROUND

The manufacture of semiconductor devices involves the performance of a series of process steps using a variety of high tech production and metrology tools in a certain order and often within a certain period of time. Photolithography is an important technology in semiconductor manufacturing. The number of masks (reticles) used in photolithography corresponds to the complexity of a manufacturing process. Photolithography affects structures of semiconductor devices, such as patterns of layers and doped regions, and determines the functional effectiveness thereof. Since photolithography is complicated, photolithography tools performing the photolithography can create a bottleneck in the manufacturing process.

A mask stocker may be used to store the masks in a wafer fabrication clean room for manufacturing. The mask stocker is a self-contained, clean environment electronic closet in which masks can be stored and from which masks can be retrieved. Generally, the cost for a mask stocker is expensive, making it impractical to provide multiple mask stockers in a factory. The mask stocker is at a specific location which operators must move to get masks for operation, a time consuming and inconvenient system. Furthermore, the operators need to manually track the location of the mask in the mask stocker, which is time consuming and can introduce human error. Such a mask stocker increases lost time of tools (e.g., photolithography tools, mask repairing tools), and decreases equipment availability and throughput of the manufacturing processes.

Thus, there is a need for an improved mask storage and retrieval system.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 4A is an isometric view of a gantry used in a mask storage system according to some embodiments.

FIG. 8 is a schematic diagram illustrating a table including mask transfer requests sent by the factory automation system according to some embodiments.

FIG. 9 is a schematic diagram illustrating a table including mask storage system access information according to some embodiments.

FIG. 13 is a schematic diagram illustrating a table including mask storage system access information according to some embodiments.

FIG. 14B is a cross-sectional view of at least a portion of a storage unit according to some embodiments.

FIG. 17 is a top view of a mask storage system according to some embodiments.

DETAILED DESCRIPTION

Figure 1:
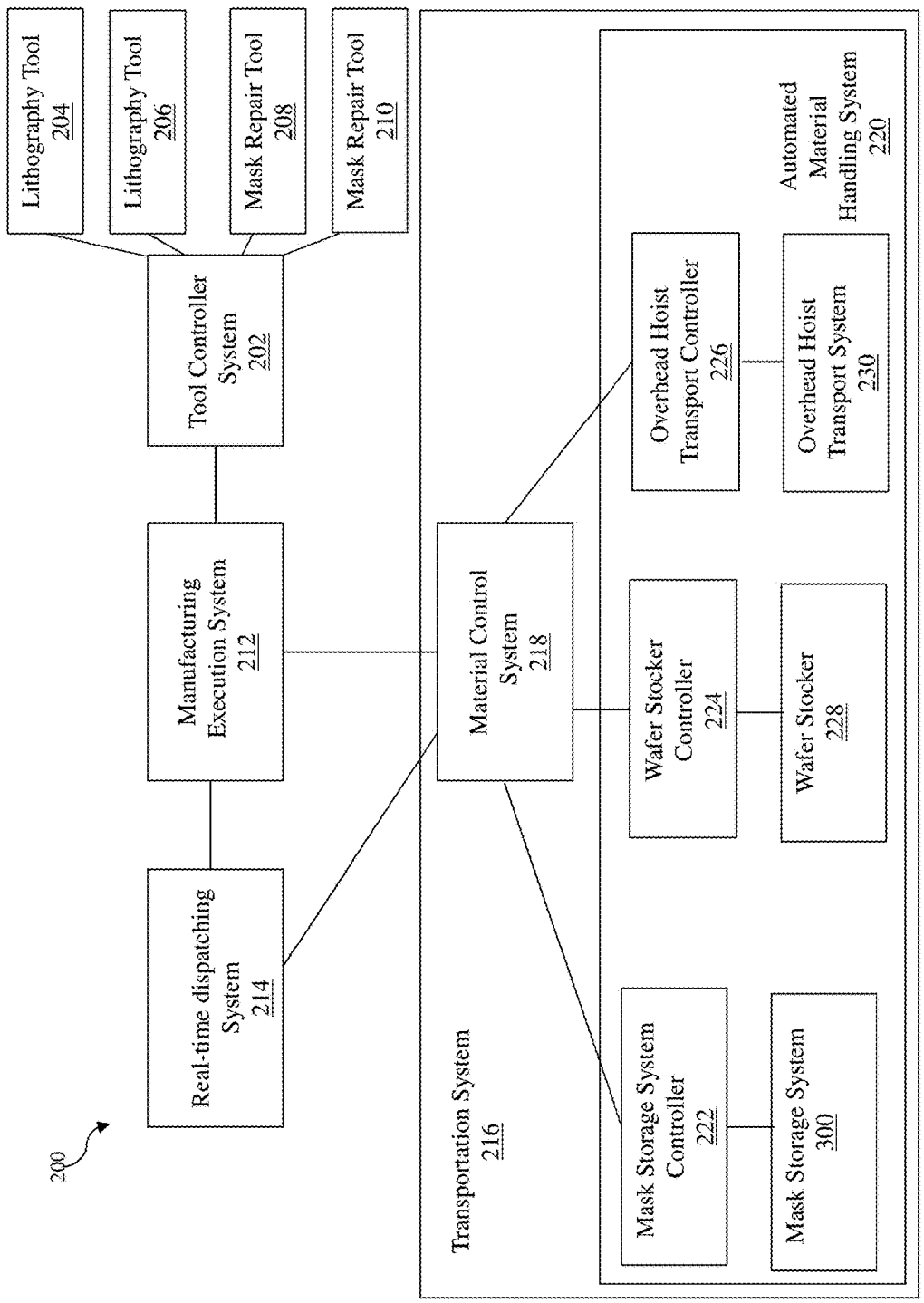
FIG. 1 is a schematic diagram illustrating a factory automation system according to some embodiments.

It is understood that the following disclosure provides many different embodiments, or examples, capable of implementing different features. Specific examples of components and arrangements are described below to simplify and thus clarify the present disclosure. These are, of course, merely examples and are not intended to be limiting. In many instances, the features of one embodiment may be combined with the features of other embodiments. In addition, the present disclosure may repeat reference numerals and/or letters in the various exemplary embodiments. This repetition is for the purpose of simplicity and clarity and does not in itself dictate a relationship between the various embodiments and/or configurations discussed.

Referring to FIG. 1, illustrated is a block diagram of an exemplary factory automation system 200 that may be implemented in a wafer fabrication facility (fab) and/or multiple fabs. The factory automation system 200 includes a tool controller system 202 having controllers connecting to various tools used in the fab, for example, a lithography tool 204, a lithography tool 206, a mask repair tool 208, a mask repair tool 210, and any other tools. The tool controller system 202 is connected to a manufacturing execution system 212, which is connected to a real-time dispatching ("RTD") system 214 and a transportation system 216. The transportation system 216 includes a material control system 218 connected to an automated material handling system ("AMHS") 220. The AMHS 220 includes a plurality of control modules, such as a mask storage system controller 222 connecting to a mask storage system 300, a wafer stocker controller 224 connecting to a wafer stocker 228, and an overhead hoist transport (OHT) controller 226 connecting to an overhead hoist transport system 230. The AMHS 220 may include additional, fewer, and different control modules.

In the example of FIG. 1, the tool controller system 202 is in communication with the manufacturing execution system 212. In some embodiments, the tool controller system 202 sends the manufacturing execution system 212a one or more mask transfer requests for transferring masks between the tools 204, 206, 208, 210 and the mask storage system 300. In some embodiments, the mask transfer requests include a mask retrieval request for retrieving a mask from the mask storage system and sending the retrieved mask to a tool. In some embodiments, the mask transfer requests include a mask storage request for picking up a mask from a tool and storing the mask in the mask storage system.

In the example of FIG. 1, the manufacturing execution system 212, real-time dispatching system 214, and transportation system 216 (including the material control system 218 and the AMHS 220) are in communication with each other. The communication between the tool controller system 202, manufacturing execution system 212, real-time dispatching system 214, and transportation system 216 may be accomplished through any suitable communication method including wired and wireless connections, including but not limited to computer networks and telecommunication networks.

Referring to FIGS. 2A, 2B, 3A, 3B, 4A, 4B, 5, and 6, illustrated therein are an exemplary mask storage system 300 and various components of the mask storage system 300. Referring to the examples of FIGS. 2A and 2B, a mask storage system 300 includes an array of storage units aligned in the x direction. A wall 362 is disposed at one end of the array of storage units, and a loading port 356 is disposed at the other end of the array of storage units. A gantry 354 is disposed across and over the array of storage units, and is movable along rails 360. The gantry 354 includes a robotic arm 366 disposed on a beam 364 of the gantry 354.

In some embodiments, the array of storage units include an end unit 304 at one end of the mask storage system 300 and a plurality of movable storage units 306, 308, 310, 312, 314, 316, 318, 320, 322, 324, 326, 328, 330, 332, and 334. The end unit 304 may be a stationary storage unit fixed on the floor or a movable storage unit located adjacent a wall 362 or other stationary structure. Each mobile storage unit is movable along the x direction using rails 340 by, for example, an electric motor connected to a drive wheel which runs along at least one of the rails 340. In an example, each mobile storage unit includes a cabinet (e.g., including shelves or racks) 336 mounted on a mobile carriage 338 for lateral movement along the rails 340 within the storage system 300. When one or more mobile storage units are moved away from an adjacent storage unit, an access aisle (space) is formed therebetween, which provides access to the storage cells of the storage unit on either side of the access aisle, where each storage cell may be configured to store one or more mask containers.

In an example, the storage system 300 includes one end unit 304 and sixty-three mobile storage units. The end unit 304 is single-sided, and includes 315 storage cells for storing 315 mask containers. Each of the sixty-three mobile storage unit is double-sided, and includes 630 storage cells for storing 630 mask containers. In that example, the storage system 300 has a capacity of storing 40,005 mask containers.

Figure 2A:
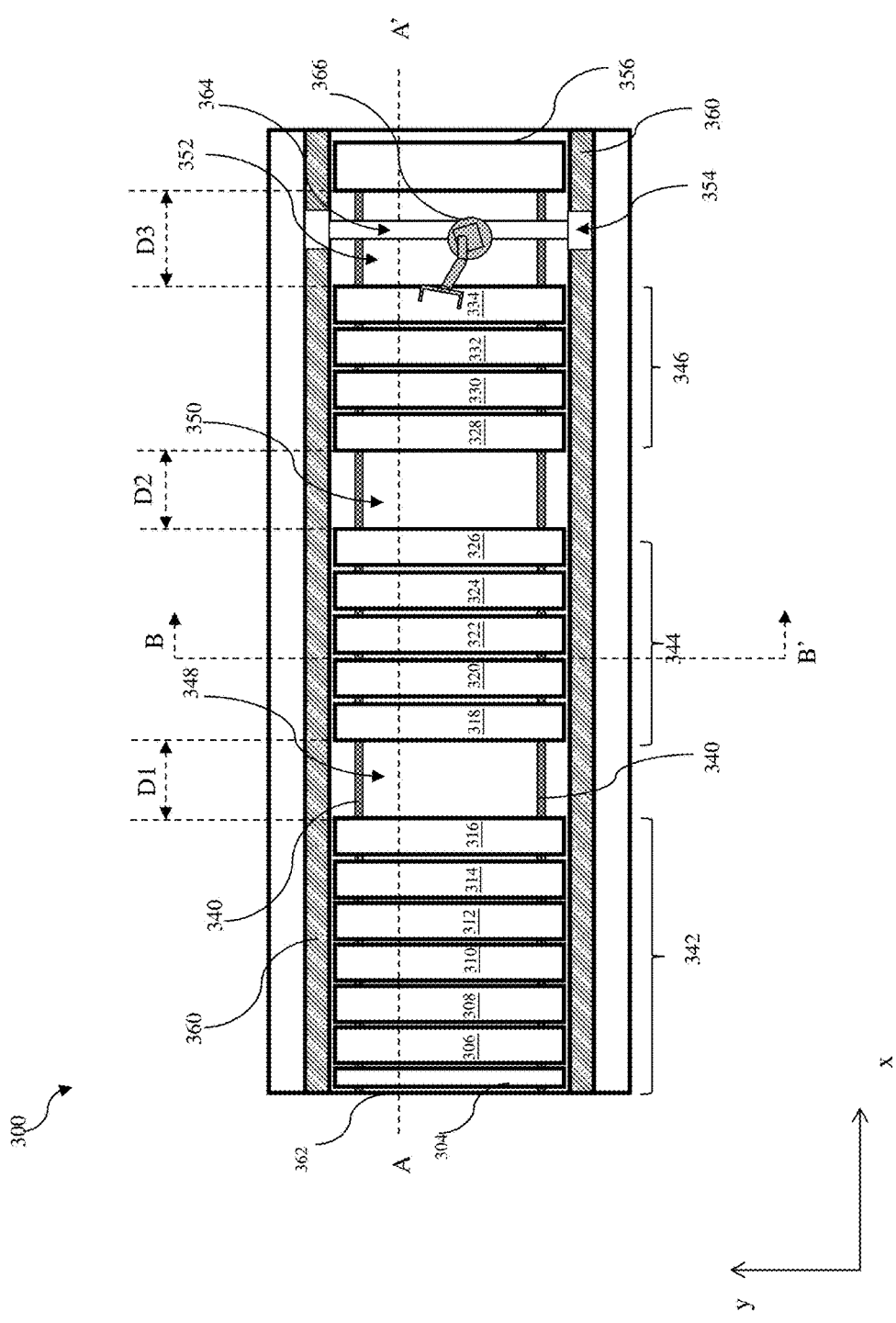
FIG. 2A is a top view of a mask storage system according to some embodiments.
Figure 2B:
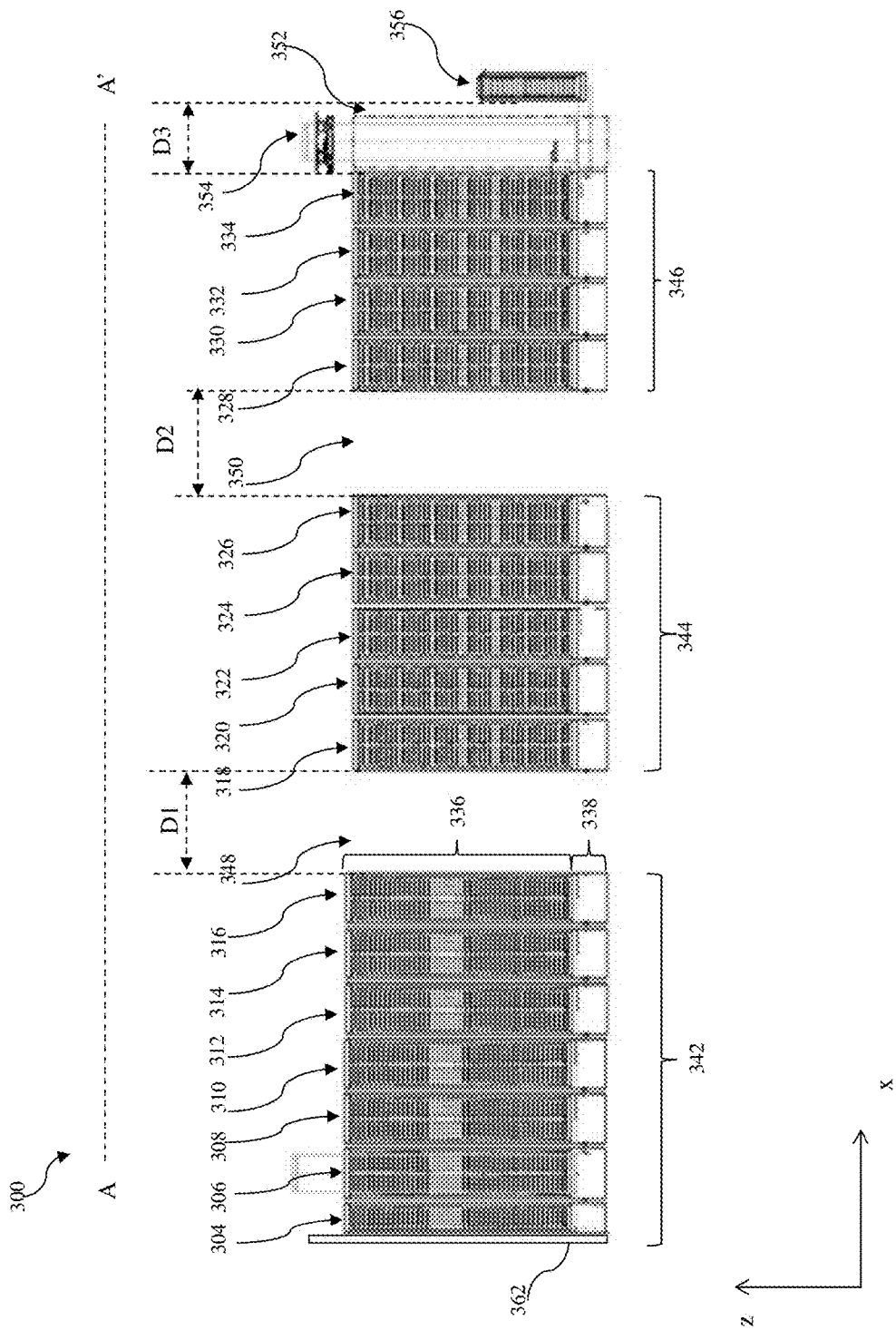
FIG. 2B is a cross-sectional view of the mask storage system of FIG. 2A according to some embodiments.

In some embodiments, an initial configuration may be applied to the mask storage system to group storage units into different storage sections. The storage sections are separated by spaces having predetermined widths. In the examples of FIGS. 2A and 2B, based on the initial configuration, a space 348 having a width D1 is established between storage sections 342 and 344, a space 350 having a width D2 is established between the storage sections 344 and 346, and a space 352 having a width D3 is established between the storage section 346 and the loading port 356. The widths of the spaces are designed so that the beam 364 of the gantry 354 is movable vertically in the spaces. For example, the widths D1, D2, and D3 are greater than a width of the beam 364.

In some embodiments, by utilizing the one or more spaces adjacent to a particular storage section, an access aisle between any two of the storage units in that particular storage section is generated by moving one or more storage units in that particular storage section without moving storage units in other storage sections. For example, mobile storage units 306, 308, 310, 312, 314, and 316 of the storage section 342 are arranged to move laterally using the space 348 to establish an access aisle between any two of those storage units. For further example, mobile storage units 318, 320, 322, 324, and 326 of the storage section 344 are arranged to move laterally using the spaces 348 and/or 350 to establish an access aisle between any two of those storage units. For further example, mobile storage units 328, 330, 332, and 334 are arranged to move laterally using the spaces 350 and/or 352 to establish an access aisle between any two of those storage units.

In some embodiments, as illustrated in the examples of FIGS. 2A and 2B, the initial configuration (e.g., the number of storage units in each storage section) is determined based on various properties (e.g., usage frequency, mask type, associated product and/or customer) of the masks stored in a particular storage section. In a particular example, a storage section for storing masks with higher usage frequencies includes fewer storage units than that of a storage section for storing masks having lower usage frequencies. In the present example, the storage section 342 adjacent to a wall 362 (and/or further away from a loading port 356) is configured to store masks used less often (e.g., having a usage frequency of less than once every three months), and has a first number of storage units (e.g., six mobile storage units including mobile storage units 306, 308, 310, 312, 314, and 316 and one stationary storage unit 304). The storage section 346 adjacent to the loading port 356 is configured to store masks used more often (e.g., having a usage frequency of greater than once every month), and has a second number of storage units (e.g., four storage units including mobile storage units 328, 330, 332, and 334). The storage section 344 disposed between the storage sections 342 and 346 is configured to store masks having mask usage frequencies (e.g., greater than once every three months but less than once every month) that are greater than those of the masks stored in the storage section 342, but less than those of the masks stored in the storage section 346. The storage section 344 includes a third number of storage units (e.g., five storage units including mobile storage units 318, 320, 322, 324, and 326), which is less than the first number of storage units in the storage section 342 (e.g., five storage units including mobile storage units 318, 320, 322, 324, and 326) and greater than the second number of storage units in the storage section 346. In that particular example, an average combined travel distance of mobile storage units for accessing a storage cell in the storage section 342 is greater than that of the storage section 344, which is greater than that of the storage section 346. Thus, by storing masks with higher usage frequencies in storage sections closer to the loading port 356, an average travel distance of the gantry 354 (e.g., moving between the storage cells and the loading port) for accessing the masks is reduced, which leads to more efficient mask storage and retrieval. Furthermore, by including more storage units in storage sections further away from the loading port, the total number of storage sections are reduced, which saves space by reducing spaces needed between storage sections.

Figure 3A:
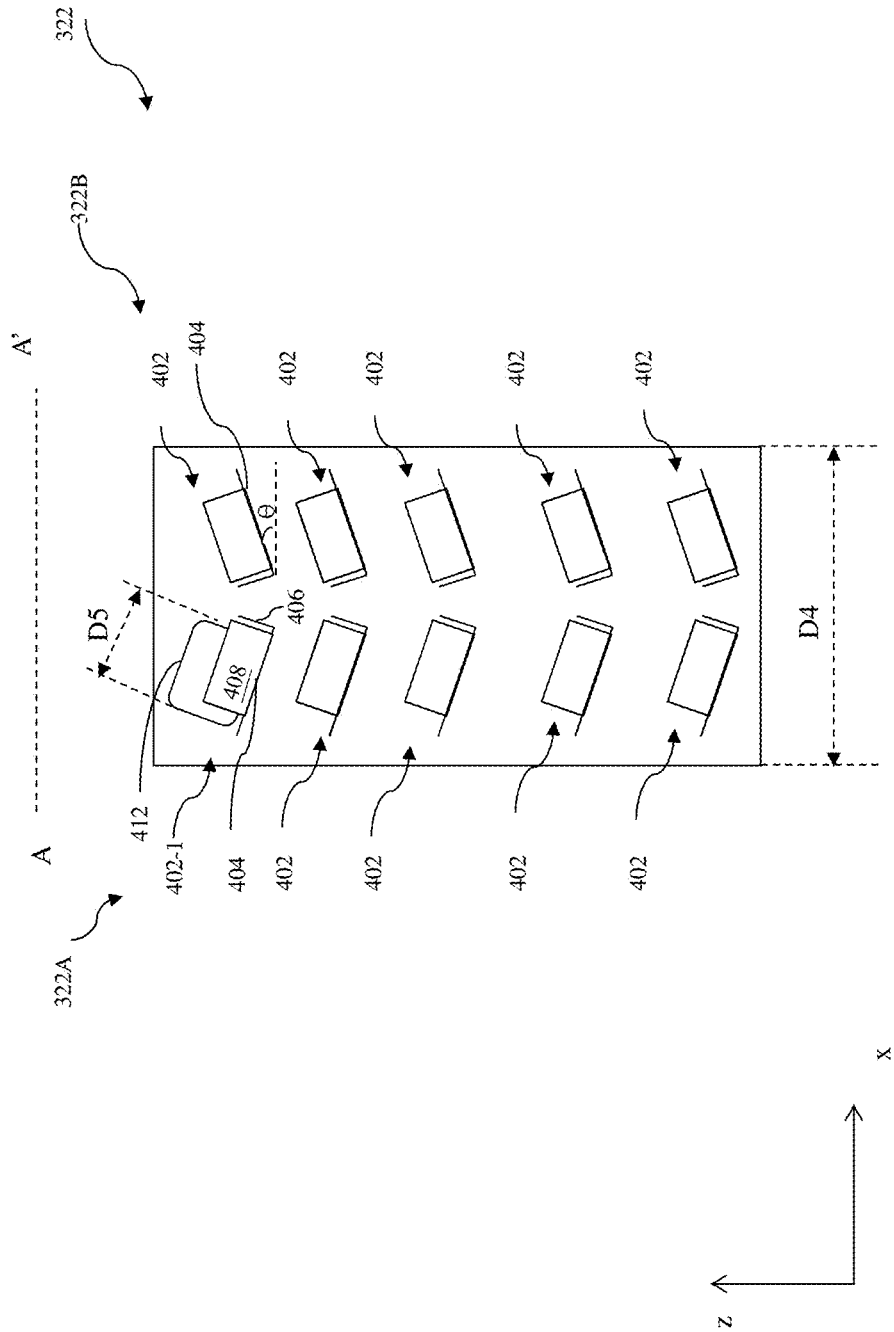
FIG. 3A is a cross-sectional view of at least a portion of a storage unit according to some embodiments.
Figure 3B:
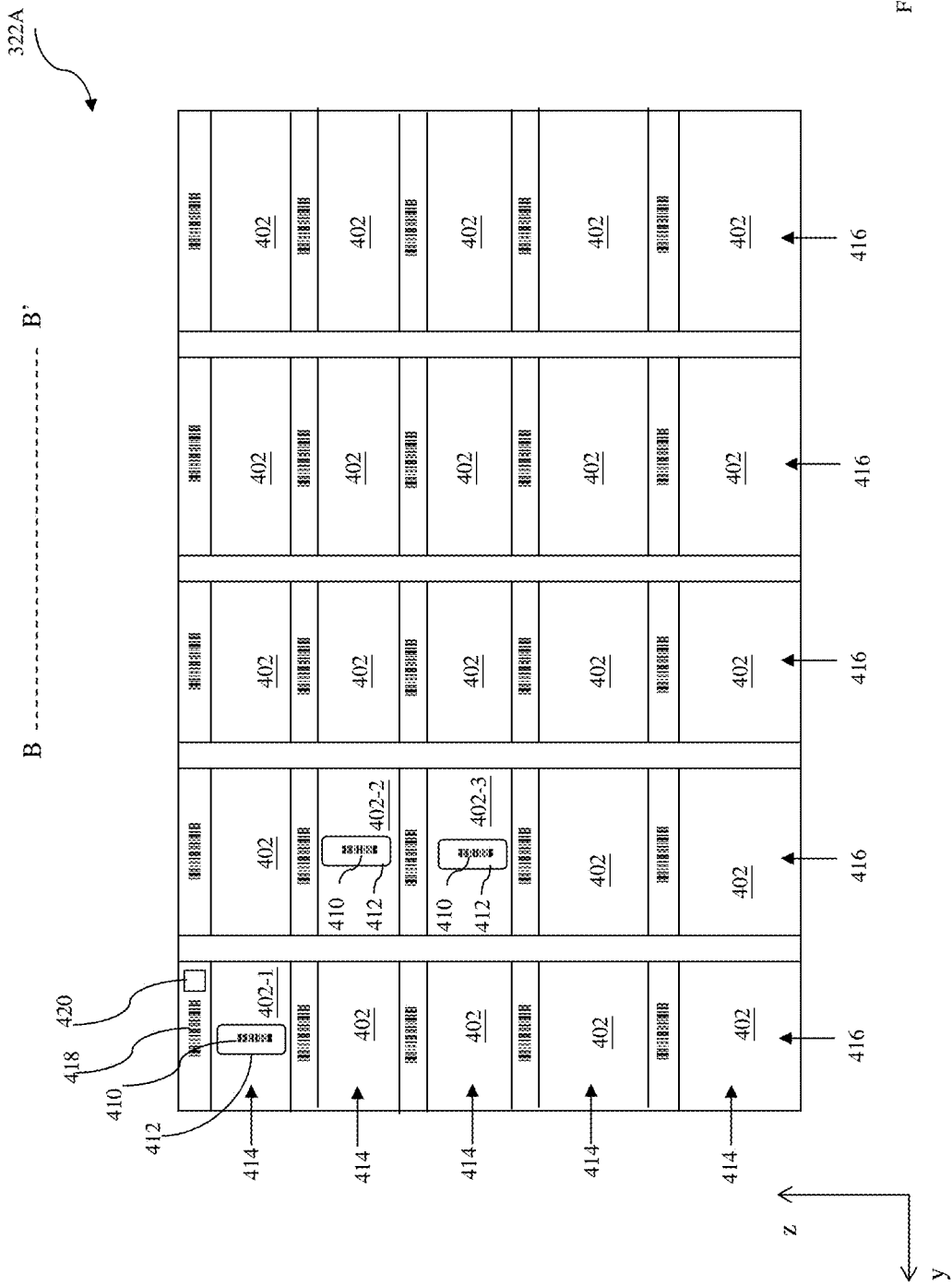
FIG. 3B is a cross-sectional view of at least a portion of the storage unit of FIG. 3A according to some embodiments.

Referring to the examples of FIGS. 3A and 3B, in some embodiments, the mobile storage units are designed to improve storage capacity and storage/retrieval accuracy and efficiency. As illustrated in the example of FIG. 3A, in some embodiments, each mobile storage unit is double sided. Illustrated in FIG. 3A is an example of a cross-sectional view along the A-A' line of FIG. 2A of a mobile storage unit 322. The mobile storage unit 322 includes a storage unit side 322A facing the wall 362, and a storage unit side 322B facing the loading port 356. Each storage unit side includes a plurality of storage cells 402. In the example of FIG. 3A, a mask container 412 is stored in the storage cell 402-1 of the storage unit side 322A.

As illustrated in FIG. 3A, in some embodiments, storage cells have sloped shelves, which helps to reduce a width of each individual storage unit in the x direction, which allows increased storage capacity by including more storage units in the mask storage system without increasing the total width of the mask storage system in the x direction. In the example of FIG. 3A, each storage cell 402 includes a shelf 404 having a slope $\Theta$ (e.g., between about 5 degrees and about 45 degrees) directed inward towards a center of the storage unit. The slope $\Theta$ may be determined based on a width D4 of the storage unit 322 and/or a width D5 of a mask container 412 storing a mask. The storage cell 402 further includes cell walls 408 and 406 (e.g., disposed substantially perpendicular to the shelf 404).

Referring to the example of FIG. 3B, in some embodiments, each storage cell 402 corresponds to a row 414 and a column 416, which may help to identify the location of the storage cell 402 in a storage unit side 322A. Each storage cell 402 includes a barcode 418 associated with a unique storage cell identifier for that storage cell 402. The barcode 418 may be scanned by a barcode scanner (e.g., located in a robotic arm 366) to retrieve the unique storage cell identifier and locate a particular storage cell. In some embodiments, a storage cell 402 includes a radio frequency identification (RFID) tag 420, which may be read by an RFID reader (e.g., located in the robotic arm 366) for identification of the storage cell.

In the example of FIG. 3B, each of the storage cells 402-1, 402-2, and 402-3 stores a mask container 412. The mask container 412 may be placed in the storage cell such that a barcode 410 on the mask container 412 is shown. The barcode 410 is associated with a unique mask identifier for a mask stored in the mask container 412. The barcode 410 may be scanned by a barcode scanner (e.g., located in a robotic arm 366) to identify the corresponding mask stored in the mask container 412. In some embodiments, a mask container 412 may include an RFID tag which may be read by an RFID reader for identification of a mask stored in the mask container 412.

Figure 4B:
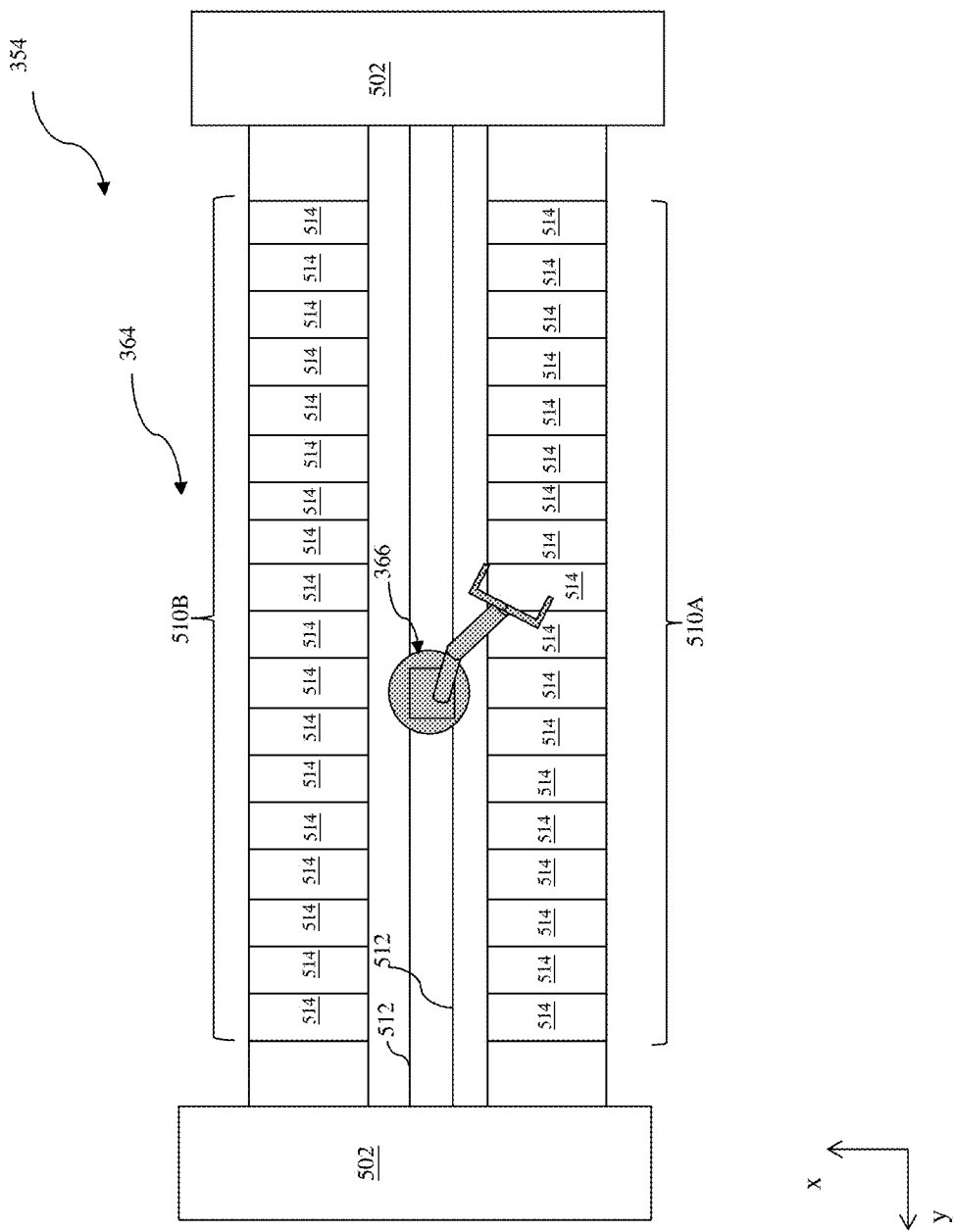
FIG. 4B is a top view of a gantry of FIG. 4A according to some embodiments.

Referring to the examples of FIGS. 4A and 4B, illustrated is an isometric view and a top view of an exemplary gantry 354 of FIG. 2A. The gantry 354 includes supporting frames 502 movable along rails 360 in the x direction by, for example, an electric motor connected to a drive wheel which runs along at least one of the rails 360. The gantry 354 includes a beam 364 connecting the supporting frames 502. The beam 364 is movable along the supporting frames 502 in the z direction by, for example, an electric motor connected to a drive wheel which runs along at least one rail in the supporting frames 502 in the z direction.

In some embodiments, the beam 364 includes a robotic arm 366 movable along rails 512 in the y direction, by for example, an electric motor connected to a drive wheel which runs along at least one of the rails 512. The beam 364 may also include mask buffer areas 510A (e.g., further away from the loading port 356) and 510B (closer to the loading port 356), which may be used to store mask containers. In some embodiments, the movements of the supporting frames 502, the beam 364, and the robotic arm 366 are controlled by using a gantry controller 506 (e.g., disposed in one of the supporting frame 502).

Referring to FIG. 4B, in some embodiments, each of the mask buffer areas 510A and 510B includes a plurality of mask buffer cells 514, where each mask buffer cell 514 is configured to store one or more mask containers, for example, a retrieved mask container from a storage cell for a mask retrieval request or a mask container to be stored in a storage cell for a mask storage request. In some embodiments, by using the mask buffer areas 510A and 510B, the mask storage system 300 processes a plurality of mask transfer requests without returning the gantry 354 to the loading port 356 for each mask transfer request.

Figure 5:
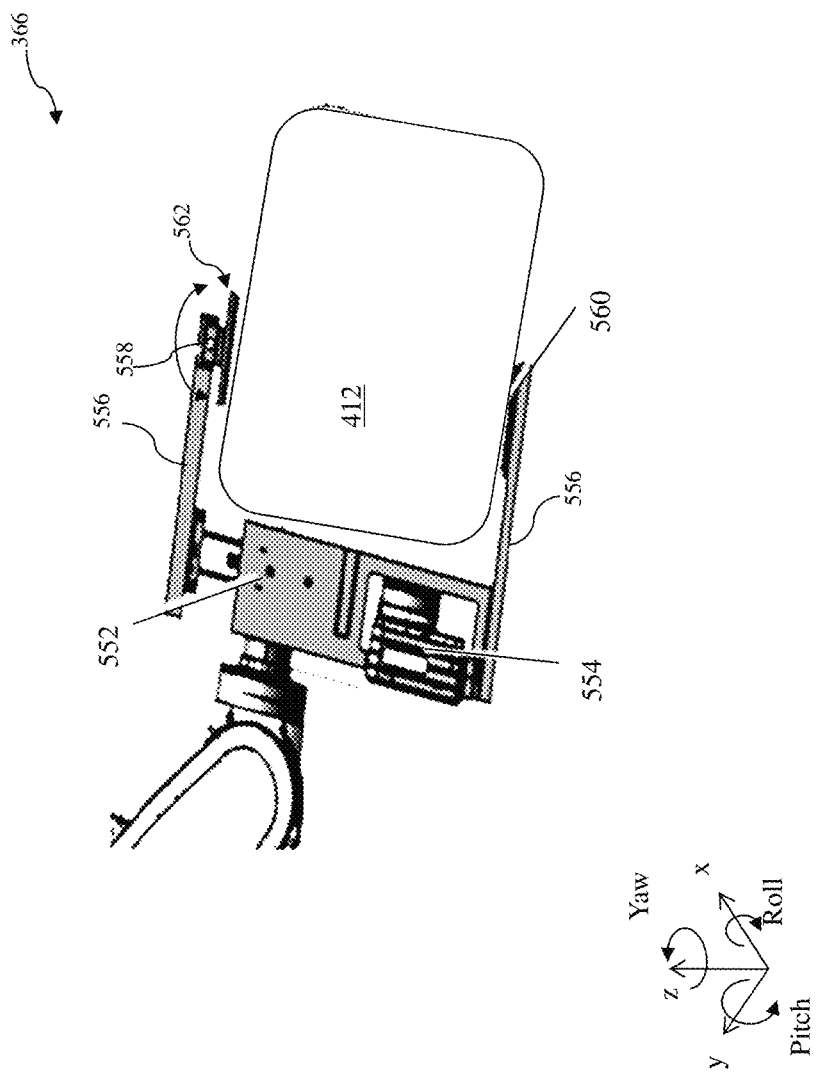
FIG. 5 is a schematic diagram illustrating at least a portion of a robotic arm according to some embodiments.

Referring to the example of FIG. 5, illustrated therein is an exemplary robotic arm 366. The robotic arm 366 includes fork-shaped hands 556 configured to handle a mask container. The distance between the fork-shaped hands 556 may be adjusted to handle mask containers having various sizes by using a double rod air cylinder 552. One or more of the fork-shaped hands 556 include a tilt compensation component 562 configured to tilt around an axis 558, and a non-slippery material 560 for better grabbing of a mask container. In some examples, the robotic arm 366 has various axis configurations (e.g., having six degrees of freedom with six axes to move forward/back in the x direction, up/down in the z direction, left/right in the y direction, pitch, yaw, and roll). In some examples, the robotic arm 366 has a system resolution (e.g., a minimum movement distance) of less than about one millimeter on a linear axis. In some embodiments, the robotic arm 366 includes a vision system 554 including an optical sensor, a laser scanner, a camera (e.g., a digital camera, a charge-coupled device (CCD) camera), an RFID reader, a barcode reader, and/or other vision devices for scanning barcodes, capturing images, detecting distances, providing position feedback, and performing other suitable functions.

In some embodiments, an initial robotic arm setup procedure is performed to teach robot movements in spatial relationship to the locations of various components in the mask storage system (e.g., storage cells, buffer cells, loading port). Such setup procedure may be used to fine tune and make adjustments to the linear travel, angular orientation, rotational movement, and positioning of the robotic arm 366 with respect to the various components in the mask storage system. Alternatively, in some embodiments, the robotic arm 366 is teaching free. In other words, auto-alignment of the robotic arm 366 and targets is achieved by using the vision system 554.

Figure 6:
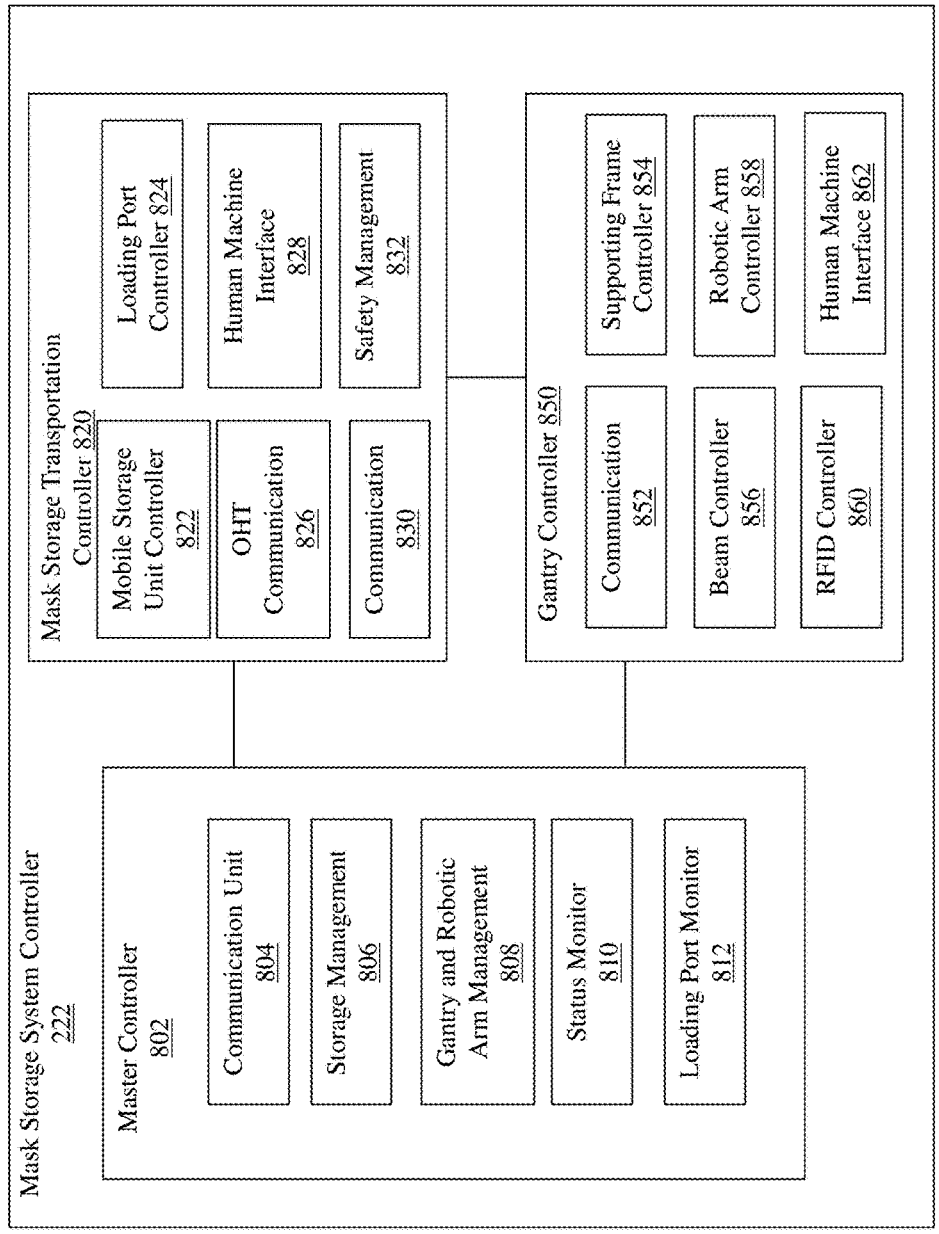
FIG. 6 is a schematic diagram illustrating a mask storage system controller according to some embodiments.

Referring to FIG. 6, illustrated is an example of a mask storage system controller 222 configured to control the mask storage system 300. The mask storage system controller 222 includes a master controller 802, a mask storage transportation controller 820 configured to control components including the storage units and the loading port 356, and a gantry controller 850 configured to control components including the supporting frames 502, the beam 364, and the robotic arm 366. In some embodiments, the master controller 802 may be provided using a host computer, a server, or a combination thereof. In some embodiments, each of the mask storage transportation controller 820 and the gantry controller 850 is provided using a programmable logic controller (PLC).

In an embodiment, the master controller 802 includes a communication unit for managing communication between the master controller 802 and the mask storage transportation controller 820, between the master controller 802 and the gantry controller 850, and between the master controller 802 and the material control system 218 and/or the manufacturing execution system 212.

In some embodiments, the master controller 802 includes a status monitor 810 and a storage management unit 806 for tracing the locations of the masks in the mask storage system (e.g., a location of a storage cell or a mask buffer cell). In some embodiments, the status monitor 810 and storage management unit 806 keep track of the statuses (e.g., empty, damaged, partially full, completely full) of the cells (including the storage cells and mask buffer cells), update a storage cell and/or a mask buffer cell assigned to a particular mask, and recalculate the access route for accessing the storage cells. In some examples, a status monitor 810 receives cell status information from the robotic arm 366 (e.g., by using the vision system 554), analyzes the cell status information, and sends the analyzed cell status to the storage management unit 806. The storage management unit 806 updates the locations of the masks and the statuses of storage cells based on steps performed in response to the received mask transfer requests and/or the storage cell status received from the status monitor 810.

In some embodiments, the storage management unit 806 is configured to update the mask usage frequencies (e.g., based on the mask transfer actions performed by the mask storage system 300). In some embodiments, the storage management unit 806 may determine a change in a usage frequency of a mask, assign a new storage cell to the mask based on its usage frequency, and moves the mask to the new storage cell. In an example, the storage management unit 806 determines that after a particular mask transfer action, a mask stored in a particular storage cell (e.g., in the storage section 344) has an increased usage frequency (e.g., increased from less than once a month to more than once a week), assigns a new storage cell closer to the loading port 356 (e.g., in the storage section 346) to the mask, and controls the mask storage system 300 to move the mask from the particular storage cell to the new storage cell. In an example, the storage management unit 806 determines that a mask stored in a particular storage cell (e.g., located in the storage section 346) has a decreased usage frequency (e.g., decreased from more than once a week to less than once a month), assigns a new storage cell further away from the loading port 356 (e.g., in the storage section 344) to the mask, and controls the mask storage system 300 to move the mask from the particular storage cell to the new storage cell.

In some embodiments, the master controller 802 includes a loading port monitor 812. In some examples, the loading port monitor 812 detects that a mask carrier including masks to be stored arrives at the loading port 356, and notifies the mask storage transportation controller 820 and its loading port controller regarding the arrival of the mask carrier. In some examples, the loading port monitor 812 detects that masks retrieved from the mask storage system have been moved to the loading port 356, and notifies the manufacturing execution system 212 for transporting the retrieved masks to respective tools.

In some embodiments, the master controller 802 includes a gantry and robotic arm management unit 808 for sending instructions to the gantry controller 850 (e.g., to the supporting frame controller 854, beam controller 856, robotic arm controller 858) for controlling the movement of the gantry 354 and the robotic arm 366.

In some embodiments, the mask storage transportation controller 820 includes a mobile storage unit controller 822 configured to control the movement of the mobile storage units, a loading port controller 824 configured to control the operation of the loading port 356, an OHT Communication unit 826 configured to communicate with the OHT controller 226 (e.g., according to the Semiconductor Equipment and Materials International (SEMI®) E84 standards for enhanced carrier handoff parallel I/O interfaces), a human machine interface unit 832, and a communication unit 830 for communication between the mask storage transportation controller 820 and the master controller 802 and communication between the mask storage transportation controller 820 and the gantry controller 850. In some examples, the human machine interface unit 832 provides, on a display, an interface for an operator to monitor the status of the storage units and loading port, review the logs, configure teaching procedures for the storage units and loading port, and perform any other operations for the storage units and loading port.

In some embodiments, the mask storage transportation controller 820 includes a safety management unit 832 for controlling various safety features of the mask management system 300, including for example, emergency machine off (EMO) for emergency stops, a light curtain including a sensor array sensing the presence of an operator, a door switch for closing/opening a door for accessing the mask management system 300, and/or any other safety features (e.g., safety features required by SEMI® 2 standards and TBC-Ip 1.5 standards).

In some embodiments, the gantry controller 850 includes a communication unit 852 configured to manage communication between the gantry controller 850 and the master controller 802, and communication between the gantry controller 850 and the mask storage transportation controller 820. The gantry controller 850 includes a supporting frame controller 854 configured to control the movement of the supporting frames 502 (e.g., by controlling an electric motor connected to a drive wheel which runs along at least one of the rails 360), a beam controller 856 configured to control the movement of the beam 364 (e.g., by controlling an electric motor connected to a drive wheel which runs along one or more vertical rails along the supporting frames 502), and a robotic arm controller 858 configured to control the movement of the robotic arm 366 (e.g., by controlling an electric motor connected to a drive wheel which runs along one or more rails 512 and/or servo-systems used by the robotic arm 366). In some examples, the gantry controller 850 includes a radio-frequency identification (RFID) controller 860 configured to control an RFID reader in the robotic arm 366. In some examples, the gantry controller 850 includes a human machine interface unit 862, which provides, on a display, an interface for an operator to monitor the status of the gantry and its components (e.g., the supporting frames, the beam, the RFID reader, the robotic arm), review the logs, perform teaching procedures for the robotic arm 366, and perform any other operations for the gantry and its components.

In various embodiments, different communication methods (e.g., serial, Ethernet, wireless, infrared, Wi-Fi, Firewire, Bluetooth, fiber optic) may be used by the master controller 802, the mask storage transportation controller 820, and the gantry controller 850. In some examples, the mask storage transportation controller 820, and the gantry controller 850 communicate using the fiber optic connections. In some examples, the master controller 802 and the gantry controller 850 communicate using serial, Ethernet, and/or fiber optic connections. In some examples, the master controller 802 and the mask storage transportation controller 820 communicate using Ethernet connections.

Figure 7:
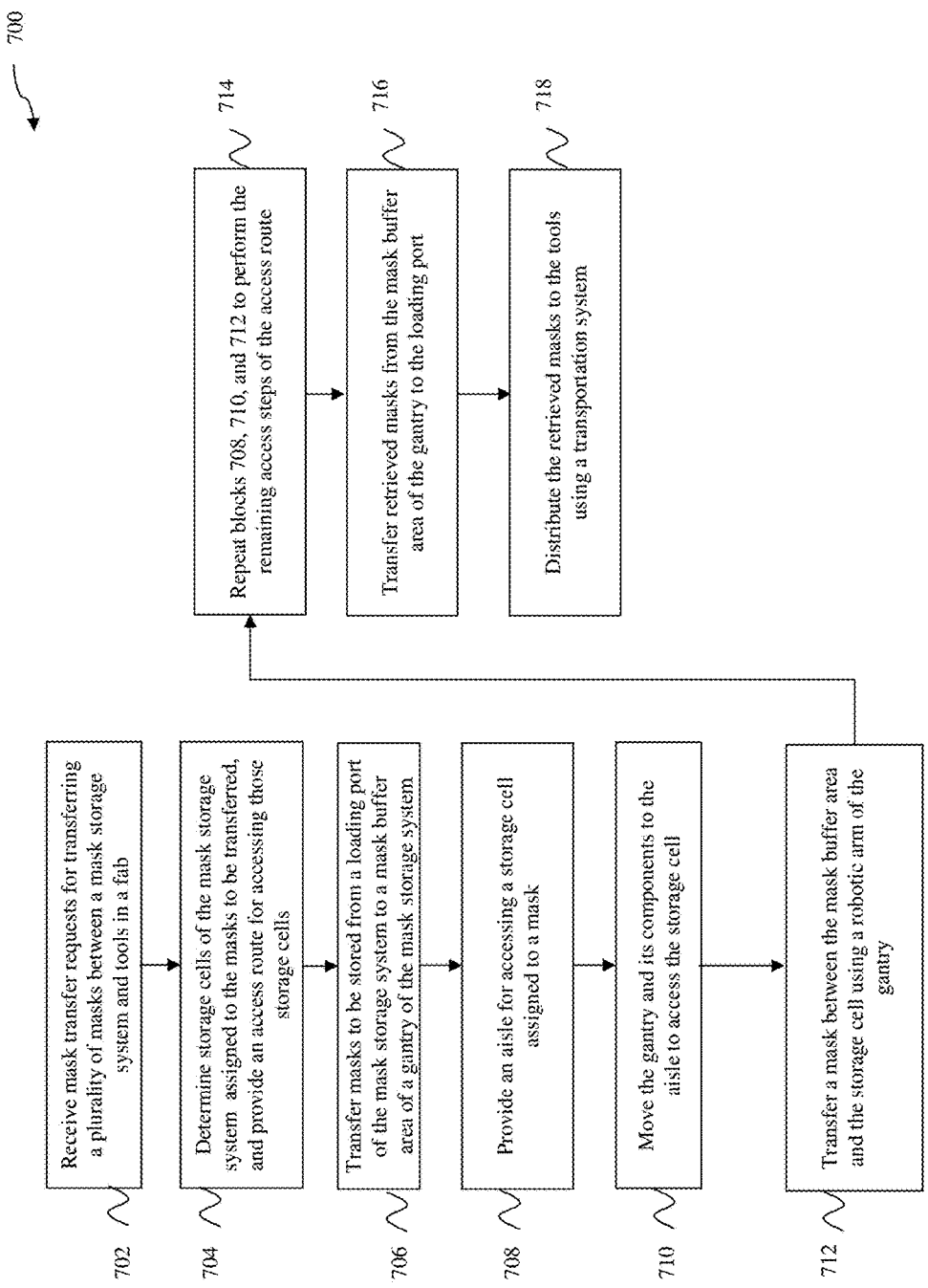
FIG. 7 is a flowchart illustrating a method of automated mask storage and retrieval according to some embodiments of the present disclosure.

Referring to FIG. 7, illustrated is a flowchart illustrating a method 700 of automated mask storage and retrieval using the factory automation system 200, including the mask storage system 300, according to some embodiments of the present disclosure. Referring to FIGS. 7 and 8, the method 700 begins at block 702, where a mask storage system receives one or more mask transfer requests for transferring masks to or from the mask storage system. In some embodiments, the mask transfer requests include a mask retrieval request for retrieving a mask from the mask storage system. In some embodiments, the mask transfer requests include a mask storage request for storing a mask in the mask storage system.

Referring to the example of FIG. 8, in an embodiment of block 702, the tool controller system 202 sends one or more mask transfer requests to the manufacturing execution system 212. The manufacturing execution system 212 may then send the mask transfer requests to the mask storage system controller 222. Illustrated in the example of FIG. 8 are the mask transfer requests 802, 804, 806, and 808 received by the manufacturing execution system 212 and stored in a mask transfer request table 800 in a mask management database coupled to the manufacturing execution system 212, transportation system 216, and/or mask storage system controller 222. The mask transfer request 802 includes a mask identifier (e.g., "M1") identifying the requested mask, a tool identifier identifying the requesting tool (e.g., the lithography tool 204), and a transfer type (e.g., "Retrieve") identifying that the mask M1 is to be retrieved from the mask storage system and then sent to the lithography tool 204. The mask transfer request 804 includes a mask identifier (e.g., "M2") identifying the requested mask, a tool identifier identifying the requesting tool (e.g., the lithography tool 206), and a transfer type (e.g., "Store") identifying that the mask M2 is to be picked up from the lithography tool 206 and then stored in the mask storage system. The mask transfer request 806 includes a mask identifier (e.g., "M3") identifying the requested mask, a tool identifier identifying the requesting tool (e.g., the mask repair tool 208), and a transfer type (e.g., "Store") identifying that the mask M3 is to be picked up from the mask repair tool 208 and then stored in the mask storage system. The mask transfer request 808 includes a mask identifier (e.g., "M4") identifying the requested mask, a tool identifier identifying the requesting tool (e.g., the mask repair tool 210), and a transfer type (e.g., "Retrieve") identifying that the mask M4 is to be retrieved from the mask storage system and then sent to the mask repair tool 210. The mask transfer requests 802 and 808 may also be referred to as the mask retrieval requests 802 and 808, and the mask transfer requests 804 and 806 may also be referred to as the mask storage requests 804 and 806.

Responsive to mask storage requests 804 and 806, the manufacturing execution system 212 generates a request to move a mask carrier (e.g., a front opening unified pod ("FOUP")) between locations in the fab to pick up the masks M2 and M3 (e.g., stored in mask containers) from the lithography tool 206 and mask repair tool 208 respectively, and then send the mask carrier containing the masks M2 and M3 to a loading port (also referred to as a loading/unloading port) of the mask storage system. Utilizing data from the manufacturing execution system 212 and the transportation system 216, the RTD system 214 determines a route for the mask carrier, for example, based on a set of RTD rules or using a route search engine. After receiving the route from the RTD system, the transportation system 216 (e.g., using an overhead hoist transport system 230 controlled by the overhead hoist transport controller 226) executes the transfer of the mask carrier to the loading port of the mask storage system according to the route provided by the RTD system 214.

Referring to FIGS. 7 and 9, the method 700 proceeds to block 704, where the storage system controller 222 determines storage cells in the storage system for the requested masks, and provide an access route for accessing those storage cells. In some embodiments, the access route includes an order of those storage cells to be accessed, which may include an order of the transfer actions associated mask transfer requests to be performed by the robotic arm 366.

In some embodiments, for a mask storage request, a storage cell is selected by a mask storage system controller 222 (e.g., using its storage management unit 806) based on a status of the storage cell (e.g., with a status of empty) and/or properties of the requested mask (e.g., usage frequency, mask type, associated product and/or customer). In some embodiments, for a mask retrieval request, a storage cell is retrieved by a mask storage system controller 222 (e.g., using its storage management unit 806) using a database storing the mapping between the storage cells and the stored masks therein.

Referring to the example of FIG. 9, in an embodiment of block 704, illustrated is a mask storage system access information table 900 stored in a mask management database. The mask storage system access information table 900 includes access information 914, 916, 918, 920 generated by mask storage system controller 222 after block 704 is performed. In the example of FIG. 9, the access information 914 provides that for the mask transfer request 802, the mask M1 is currently stored in a storage cell S1 located at the intersection of the fourth column and the second row of a storage unit side 308A. The access information 916 provides that for the mask transfer request 804, the storage cell S2 located at the intersection of the second column and fourth row of a storage unit 330B is available to store the mask M2. The access information 918 provides that for the mask transfer request 806, the storage cell S3 located at the intersection of the fifth column and fifth row of a storage unit 322B is available to store the mask M3. The access information 920 provides that for the mask transfer request 808, the mask M4 is currently stored in a storage cell S4 located at the intersection of the second column and the first row of a storage unit side 332A.

In some embodiments, at block 704, a mask storage system controller 222 determines an access route for accessing the storage cells S1, S2, S3, and S4. In some embodiments, the access route is determined based on a travel distance of the mobile storage units in the x direction, a travel distance of the gantry 354 in the x direction, a travel distance of the beam 364 in the z direction, a travel distance of the robotic arm 366 in the y direction, and/or a combination thereof. In some embodiments, the different travel distances are given different weights in determining the access route. In some examples, a travel distance of the mobile storage units in the x direction is given a greater weight than a travel distance of the gantry 354 in the x direction. In some examples, a travel distance of the gantry 354 in the x direction is given a greater weight than a travel distance of the beam 364 in the z direction. In some examples, a travel distance of the beam 364 in the z direction is given a greater weight than a travel distance of the robotic arm 366 in the y direction. In some embodiments, the access route is determined based on travel times of the mobile storage units, the gantry 354, the beam 364, the robotic arm 366, and/or a combination thereof (e.g., by using the respective travel distances and speeds of movement).

In the example of FIG. 9, an access route 922 is provided to identify an order for accessing the storage cells S1, S2, S3, and S4. The access route 922 includes a first step of storing the mask M2 in storage cell S2, followed by a second step of retrieving the mask M4 from storage cell S4, followed by a third step of storing the mask M3 in storage cell S3, and then followed by a fourth step of retrieving the mask M1 from storage cell S1.

Figure 10:
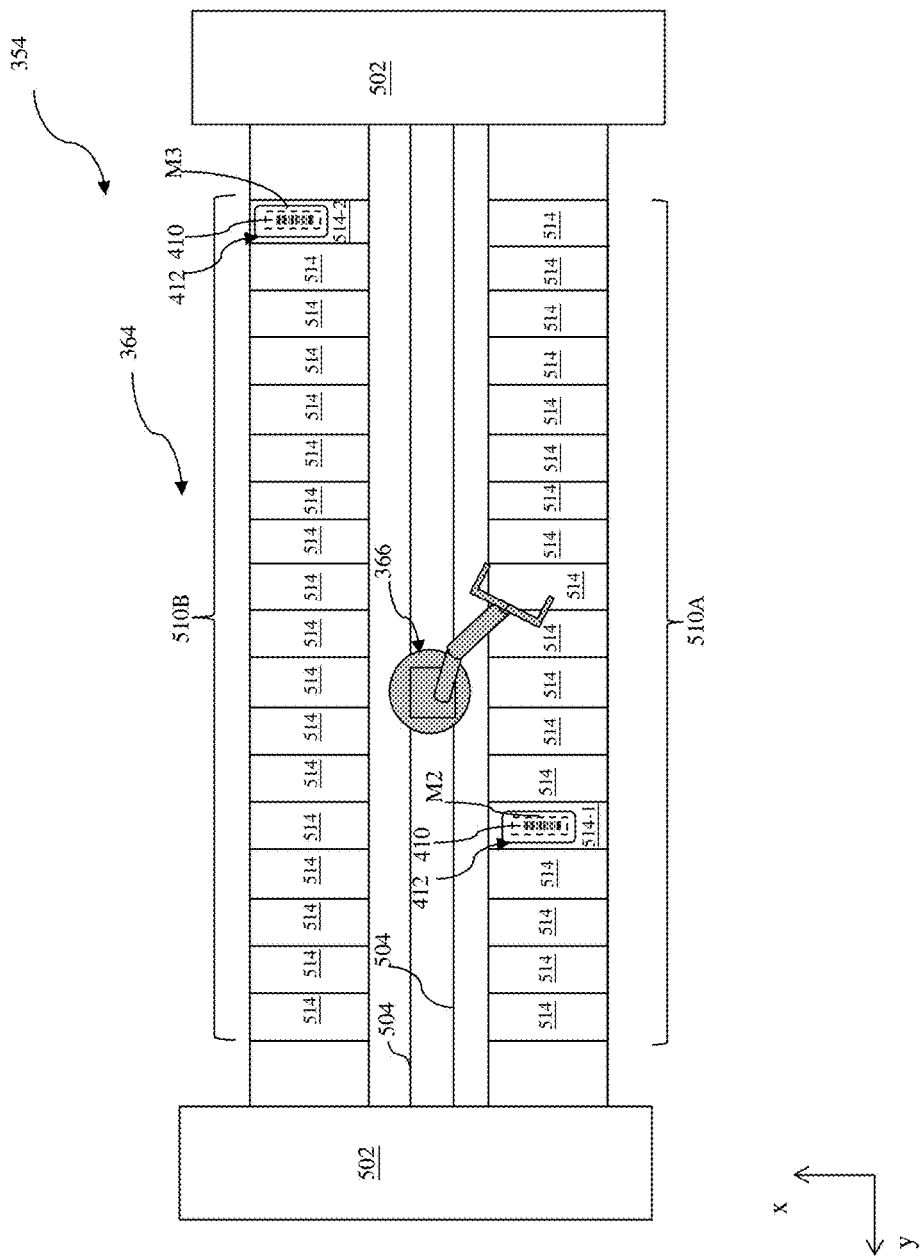
FIG. 10 is a top view of a gantry according to some embodiments.

Referring to FIGS. 7 and 10, the method 700 proceeds to block 706, where masks M2 and M4 of the mask storage requests 804 and 808 are moved from a mask loading port 356 to a mask buffer area 510 in a gantry 354 of the mask storage system 300.

In some embodiments, as discussed above with reference to FIGS. 2A and 2B, responsive to the mask storage requests 804 and 808, the manufacturing execution system 212, the transportation system 216, and the RTD system 214 transfer a mask carrier having mask containers containing masks M2 and M4 to the loading port 356 of the mask storage system 300. A loading port monitor 812 of the master controller 802 detects the arrival of the mask carrier at the loading port 356, and sends a notification about the arrival of the mask carrier to the loading port controller 824 of the mask storage transportation controller 820 for receiving the mask carrier. In some embodiments, the loading port monitor 812 notifies the gantry controller 850 to pick up the mask containers containing masks M2 and M4 from the loading port 356.

In some embodiments, in response to a notification for picking up masks at the loading port 356, the gantry 354 is moved to be adjacent to the loading port 356. The robotic arm 356 retrieves the mask containers from the loading port 356 (e.g., from a mask carrier), and stores the mask containers in mask buffer cells 514 assigned to the mask containers.

In some embodiments, a mask buffer cell for storing a particular mask is determined (e.g., by the mask storage system controller 222) based on the location (e.g., a storage unit side, a column number) of the storage cell assigned to the particular mask (e.g., to minimize travel distances of the robotic arm 366 in the y direction). For example, the assigned storage cell S2 for the mask M2 is located in a storage unit side 330B facing the loading port 356. To reduce the movement of the robotic arm 366 (e.g., rotating around a radius axis of the robotic arm 366), a mask buffer cell 514-1 located in a mask buffer area 510A facing away from the loading port 356 is selected. For further example, to reduce the movement of the robotic arm 366 in the y direction, a location of the mask buffer cell 514-1 is determined based on a column number (e.g., 2) of the storage cell S2, so that the mask buffer cell 514-1 and the storage cell S2 are aligned substantially in the x direction. Similarly, the mask buffer cell 514-2 of a mask buffer area 510B is determined based on the assigned storage cell S4 for the mask M4, where the assigned storage cell S4 is located at the fifth column and fifth row of a storage unit side 322A, so that the mask buffer cell 514-1 and the storage cell S2 are aligned substantially in the x direction.

In the example of FIG. 10, a mask container 412 for a mask M2 is stored in a mask buffer cell 514-1 of the mask buffer area 510B, and a mask container 412 for a mask M4 is stored in a mask buffer cell 514-2 of the mask buffer area 510A. In some examples, the mask storage system controller 222 (e.g., using the storage management unit 806) automatically updates the locations of masks M2 and M4 with the corresponding mask buffer cells 514-1 and 514-2, for example, based on mask buffer cell identifiers detected by the robotic arm 366 by reading barcodes or RFID tags attached to the mask buffer cells.

Figure 11:
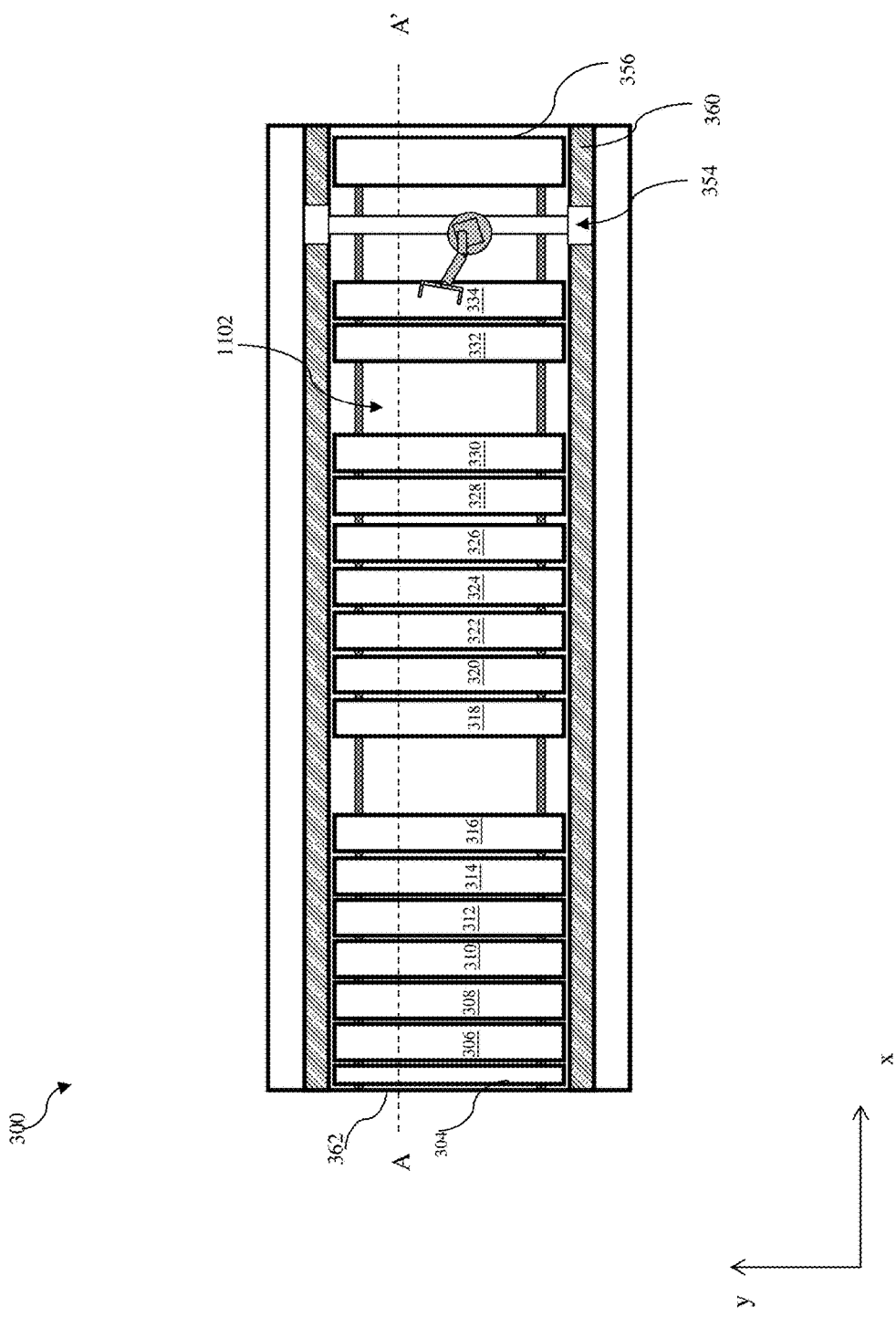
FIG. 11 is a top view of a mask storage system according to some embodiments.

Referring to FIGS. 7 and 11, the method 700 then proceeds to block 708, where an aisle for accessing a storage cell S2 in a storage unit side 330B is provided according to the access route 922. Referring to FIG. 11, in an embodiment of block 708, an aisle 1102 has been generated by moving mobile storage units 328 and 330 towards the wall 362 for accessing the storage unit side 330B.

Figure 12A:
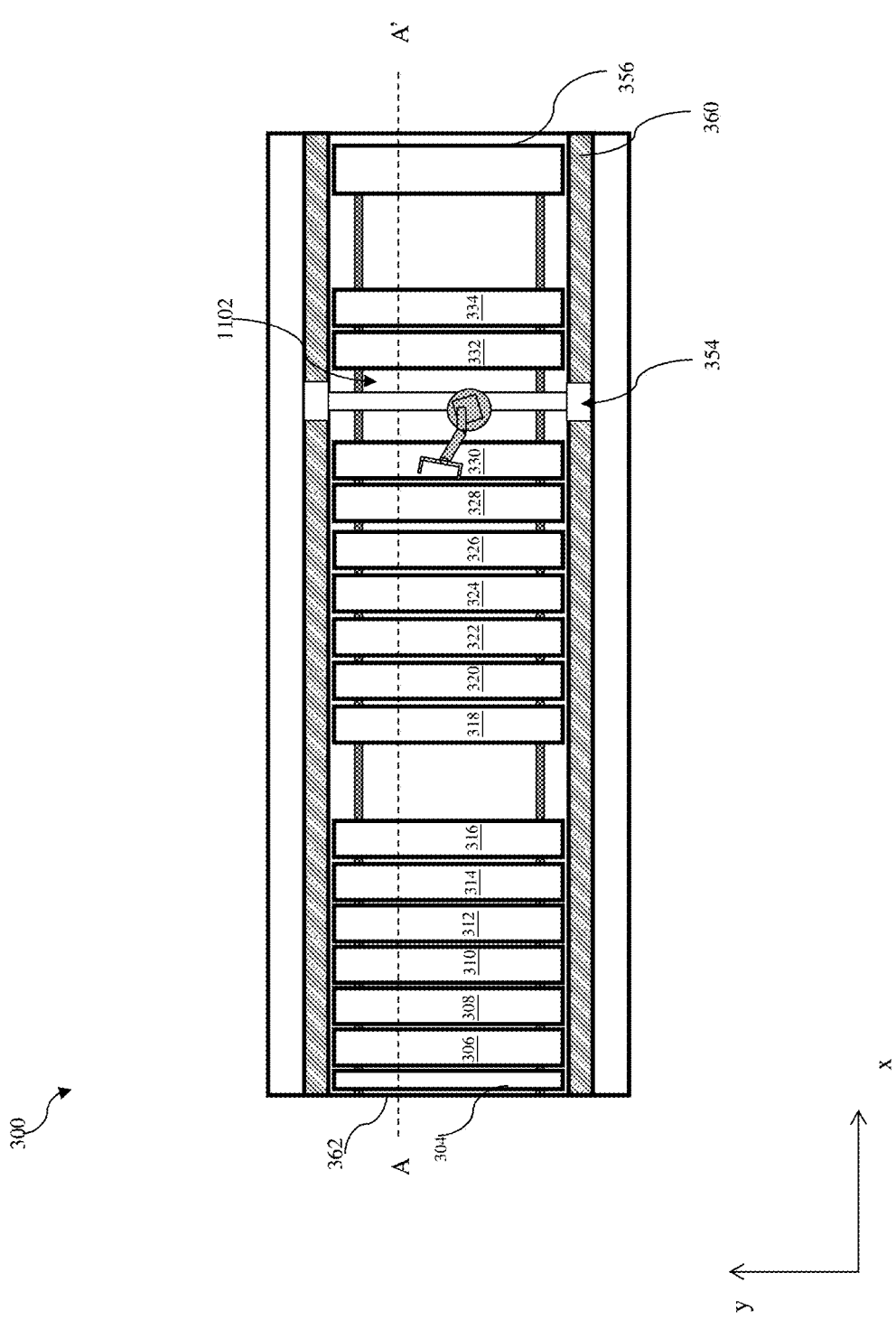
FIG. 12A is a top view of a mask storage system according to some embodiments.
Figure 12B:
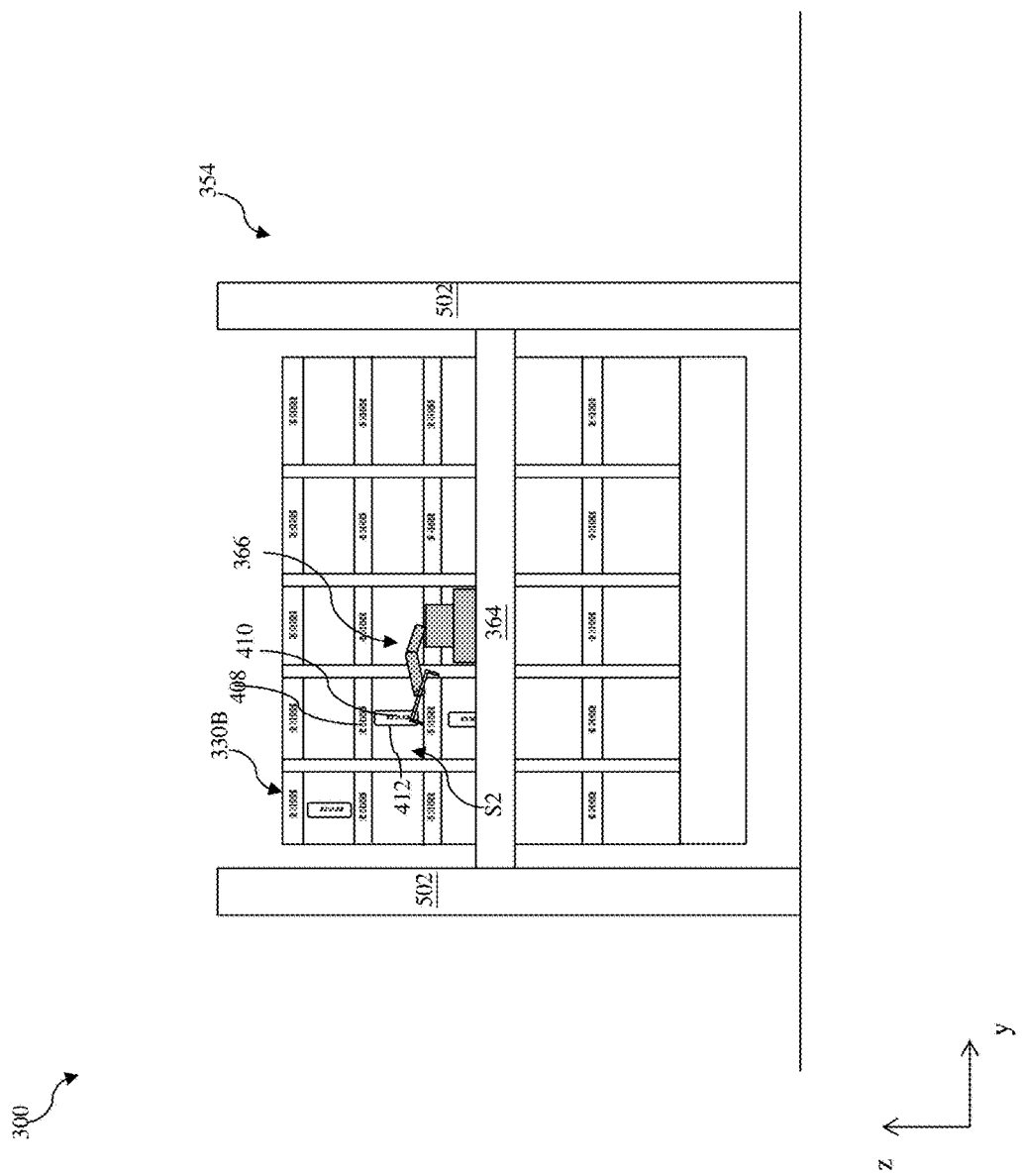
FIG. 12B is a cross-sectional view of the mask storage system of FIG. 12A according to some embodiments.

Referring to FIGS. 7, 12A, and 12B, the method 700 proceeds to block 710, where a gantry and its components are moved to access the storage cell. Referring to the example of FIG. 12A, the gantry 354 is moved to be disposed over the aisle 1102, for example, by moving the supporting frames 502 along the rails 360. In some examples, prior to moving the supporting frames 502 of the gantry 354, the beam 364 is raised (e.g., to the top of the supporting frames 502) to have a height greater than a height of the storage units. Referring to the example of FIG. 12B, after the gantry reaches the aisle 1102, the beam 364 of the gantry 354 is moved along the supporting frames 502 (e.g., lowered from the top of the supporting frames 502) to be at a height substantially similar to a height of the storage cell S3. In some embodiments, the robotic arm 366 is moved in the y direction so that it may reach the storage cell S2.

Referring to FIG. 13, in some embodiments, the vision system 554 of the robotic arm 366 captures storage cell status information (e.g., an image of the storage cell S2, identifications of the containers already stored in the storage cell S2) for the storage cell S2, and sends the storage cell status information to a status monitor 810 of the master controller 802. In some examples, the status monitor 810 analyzes the storage cell status information, determines that the storage cell S2 is not available to store the mask M2 (e.g., the storage cell S2 is damaged, or one or more containers have been stored in the storage cell S2 and the storage cell S2 has reached its full capacity). In such examples, the status monitor 810 sends the storage cell status of the storage cell S2 to the storage management unit 806, which updates the status of the storage cell S2, assigns another storage cell S5 to the mask M2, and updates the access route 922 for accessing storage cells S1, S5, S3, and S4.

Illustrated in FIG. 13 is an example of updated mask storage system access information after the storage cell assignment for the mask M2 and/or the access route has been updated based on the storage cell status of the storage cell S2. In the example of FIG. 13, the access information 1304 provides that for the mask transfer request 804, a storage cell S5 at the first column and third row of the storage unit side 330B is assigned to store the mask M2. In some examples, a storage cell S5 accessible from an existing aisle 1102 (e.g., located in storage unit sides 330B or 332A) is assigned to the mask M2 to reduce changes to the access route 922. In the example of FIG. 13, the order of the access route steps of the access route 922 for handling the masks M1, M2, M3, and M4 remains the same, which includes a first step of storing the mask M2 in storage cell S5, followed by a second step of retrieving the mask M4 from storage cell S4, followed by a third step of storing the mask M3 in storage cell S3, and then followed by a fourth step of retrieving the mask M1 from storage cell S1.

In some examples, the storage cell S5 is located in a storage unit side not accessible from existing aisles. In such examples, the order of the access route steps of the access route 922 for handling the masks M1, M2, M3, and M4 the access route 922 may be adjusted according to the location of the storage cell S5. The adjustment may be based on a total travel distance or a total travel time of various components (e.g., the mobile storage units, the supporting frames 502 of the gantry 354, the beam 364 of the gantry 354, and the robotic arm 366) of the mask storage system for accessing storage cells S1, S5, S3, and S4. The mobile storage units and the gantry 354 may be moved based on the updated access route 922 to generate an access aisle for performing the first step in the access route 922.

Referring to FIG. 7, the method 700 proceeds to block 712, where a container containing a mask is transferred between a mask buffer area and the storage cell assigned to the mask. For mask retrieval requests (e.g., mask retrieval requests 802 and 808), the robotic arm 366 retrieves a container from the storage cell, and stores the retrieved container in a mask buffer cell 514 of the beam 364. For mask storage requests (e.g., mask storage requests 804 and 806), the robotic arm 366 retrieves a container from the mask buffer cell 514 of the beam 364, and stores the retrieved container in the storage cell.

Figure 14A:
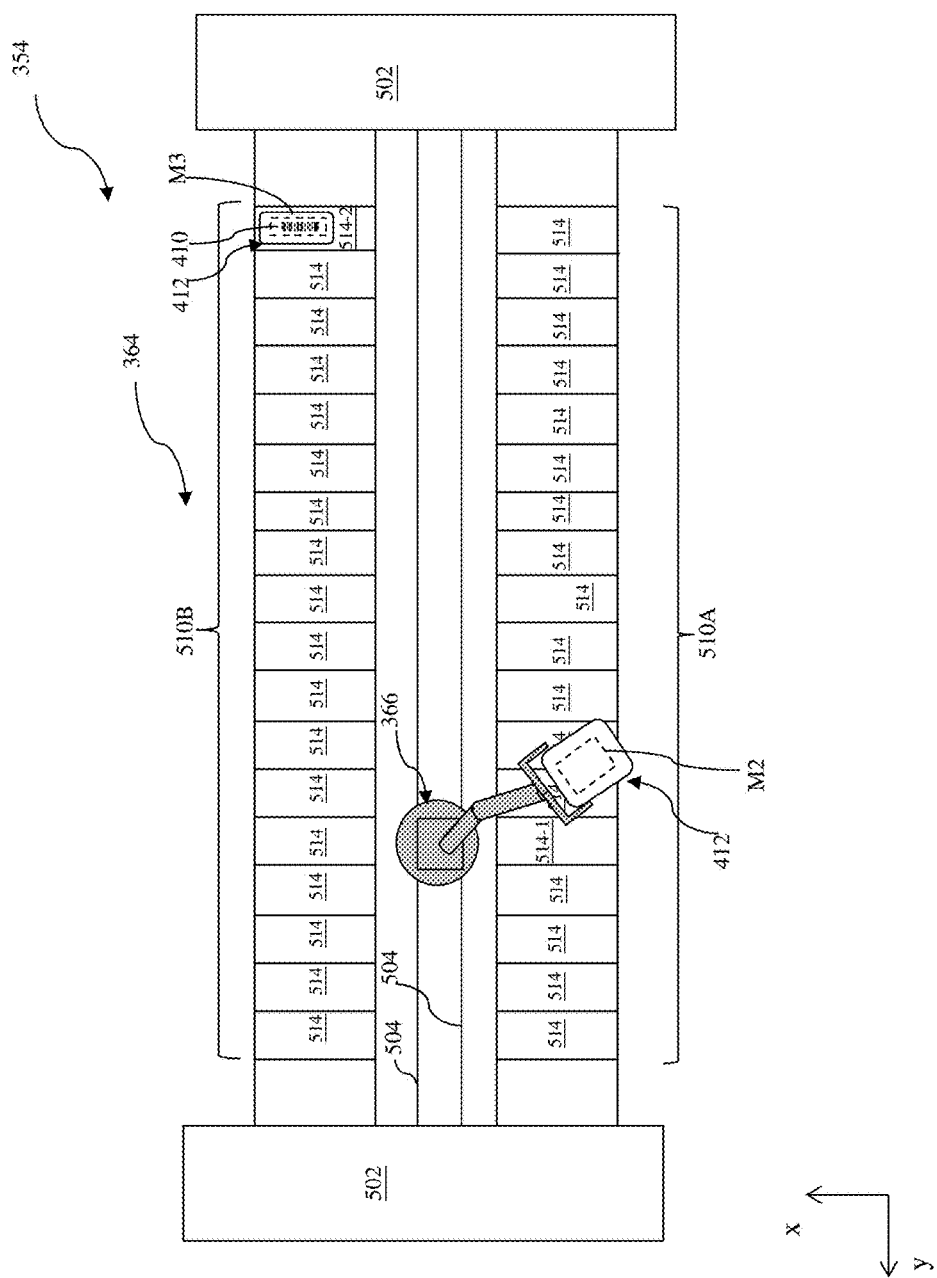
FIG. 14A is a top view of a gantry according to some embodiments.

Referring to the examples of FIGS. 14A and 14B, a first step 1302A of the access route 922 is performed. According to the mask storage system access information 1304, for the mask transfer request 804, the mask M2 is to be stored in the storage cell S5. Illustrated in FIG. 14A is a robotic arm 366 controlled to retrieve a container 412 containing the mask M2 from the mask buffer cell 514-1 (e.g., based on a mask location provided by the mask storage system controller 222). Referring to FIG. 14B, the robotic arm 366 is controlled to place the mask container 412 in the storage cell S5. As illustrated in FIG. 14B, the fork-shaped hands 556 and tilt compensation component 562 of the robotic arm 366 are adjusted based on the slope Θ of a shelf of the storage cell S5, which may reduce the damage to the container and the mask M2 stored therein and increase storage efficiency and reliability. In some examples, the vision system 554 of the robotic arm 366 detects the location and the slope of the storage cell S5, which help to perform auto teaching and determine the axis parameters for controlling the robotic arm 366 (e.g. the fork-shaped hands 556 and tilt compensation component 562) according to the slope.

Referring to FIGS. 7, 15, 16, and 17, the method 700 proceeds to block 714, where blocks 708, 710, and 712 are repeated to perform the remaining access steps of the access route 922.

Figure 15:
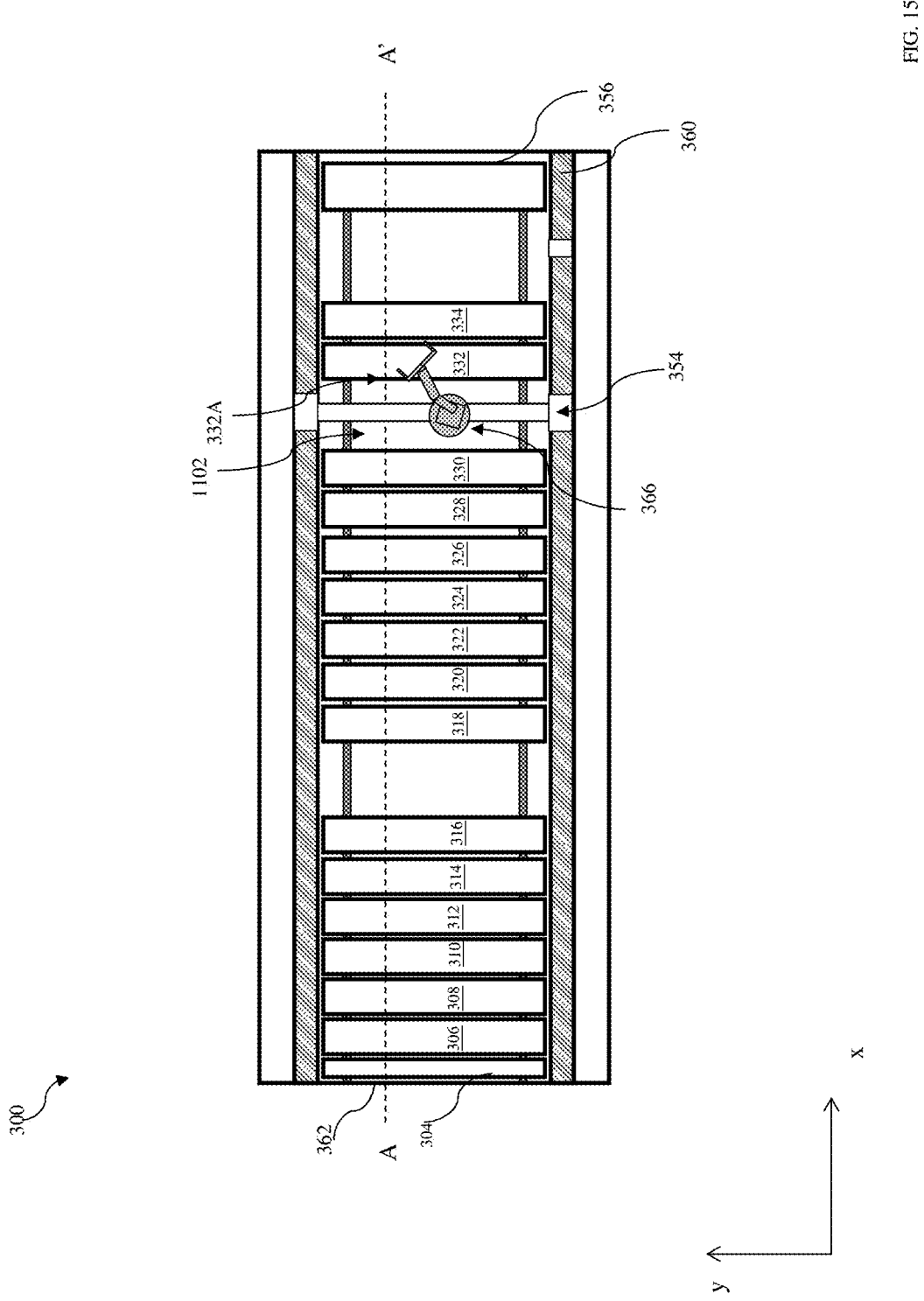
FIG. 15 is a top view of the mask storage system of FIG. 2A according to some embodiments.

Referring to the example of FIG. 15, after performing the first step 1302A of the access route 922, blocks 708, 710, and 712 are repeated to perform a second step 1302B to retrieve the mask M4 from storage cell S4. In a particular example, at block 708, it is determined that the storage cell S4 is accessible using the aisle 1102. In such example, no further movement of the mobile storage units is performed at block 708. At block 710, the robotic arm 366 arrives (e.g., by moving the beam 364 in the z direction and moving the robotic arm 366 in the y direction) at a position where it can reach the storage cell S4 located at the second column and first row of the storage unit side 332A. A vision system 554 may read the storage cell identifier of the storage cell S4 and/or the mask identifier of the mask container 412 stored in the storage cell S4 for locating the storage cell S4 and/or the container 412. At block 712, the robotic arm 366 is controlled to retrieve the container containing mask M4, and store the container in a mask buffer cell (e.g., in a mask buffer area 510B facing the storage unit side 332A and aligned with the storage cell S4 in the x direction) determined based on the location of the storage cell S4).

Figure 16:
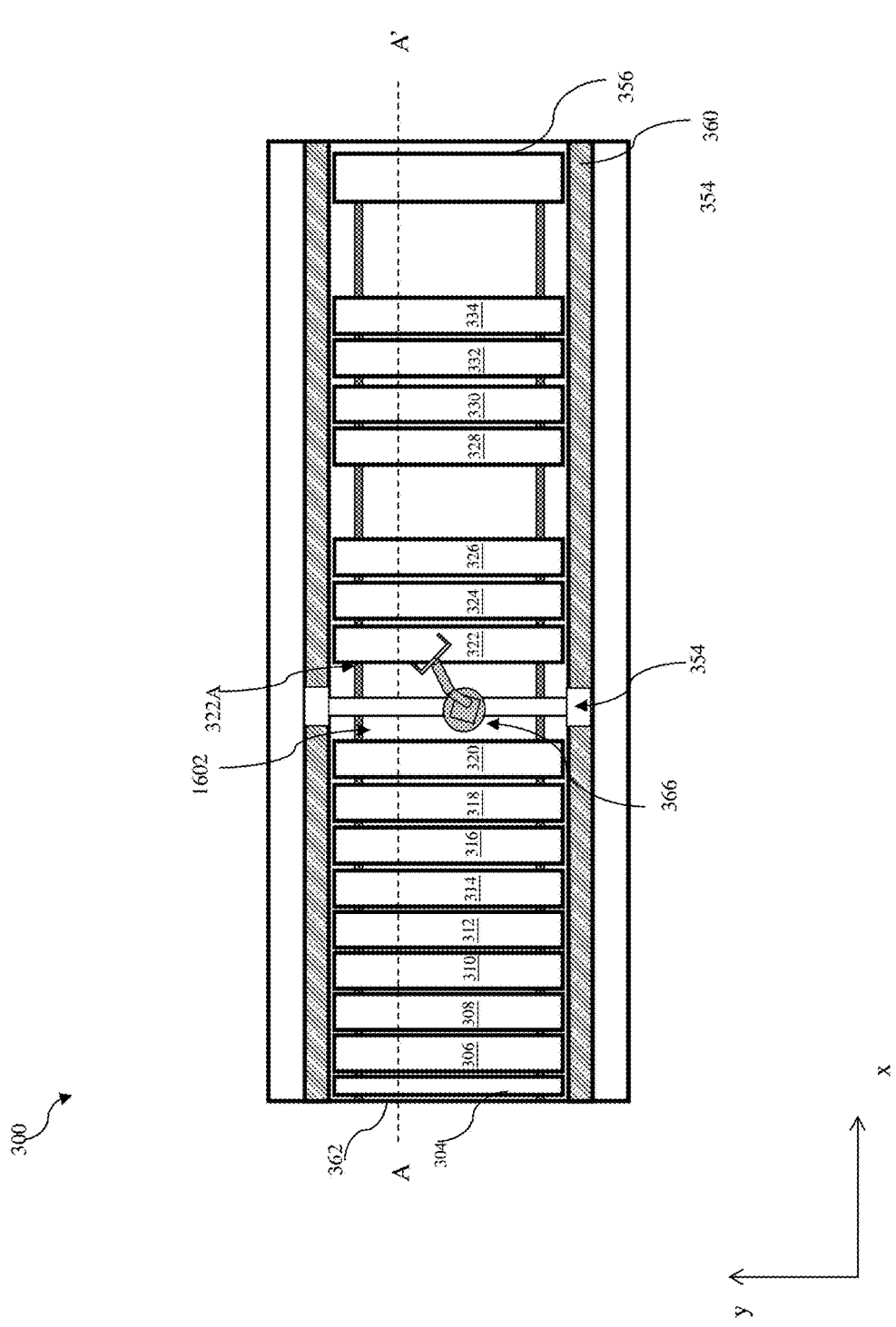
FIG. 16 is a top view of a mask storage system according to some embodiments.

Referring to the example of FIG. 16, after performing the second step 1302B of the access route 922, blocks 708, 710, and 712 are repeated to perform a third step 1302C of storing a mask M3 in storage cell S3 located in storage unit side 322A. In the example of FIG. 16, at block 708, mobile storage units 318 and 320 are moved to generate an access aisle 1602 for accessing storage cell S3 in the storage unit side 322A. In some examples, at block 708, the mobile storage units 328 and 330 are moved back to their initial positions according to the initial configuration discussed above with reference to FIGS. 2A and 2B. At block 710, the robotic arm 366 arrives (e.g., by moving supporting frames 502 of the gantry 354 in the x direction, moving the beam 364 in the z direction, and moving the robotic arm 366 in the y direction) at a position where it can reach the storage cell S3 located at the fifth column and fifth row of the storage unit side 322A. At block 712, the robotic arm 366 retrieves the mask container containing mask M3 from a mask buffer cell 514-2 (e.g., by reading a mask identifier on the mask container to locate the mask container), and stores the mask container containing mask M3 in the storage cell S3 (e.g., by reading the storage cell identifier of the storage cell S3 to locate the storage cell S3).

Referring to the example of FIG. 17, after performing the third step 1302C of the access route 922, blocks 708, 710, and 712 are repeated to perform a fourth step 1302D retrieving the mask M1 from storage cell S1. At block 708, mobile storage units 318 and 320 are moved back to their initial positions according to the initial configuration discussed above with reference to FIGS. 2A and 2B. Mobile storage units 308, 310, 312, 314, and 316 of the storage section 342 are then moved to generate an access aisle 1702 for accessing storage cell S1 in the storage unit side 308A. At block 710, the robotic arm 366 arrives (e.g., by moving supporting frames 502 of the gantry 354 in the x direction, the beam 364 in the z direction, and moving the robotic arm 366 in the y direction) at a position where it can reach the storage cell S1 located at the fourth column and second row of the storage unit side 308A. At block 712, the robotic arm 366 retrieves the mask container containing mask M1 from the storage cell S1, and stores the retrieved mask container in a mask buffer cell (e.g., in a mask buffer area 510B facing the storage unit side 308A and aligned with the storage cell S1 in the x direction) determined based on the location of the storage cell S1).

Figure 18A:
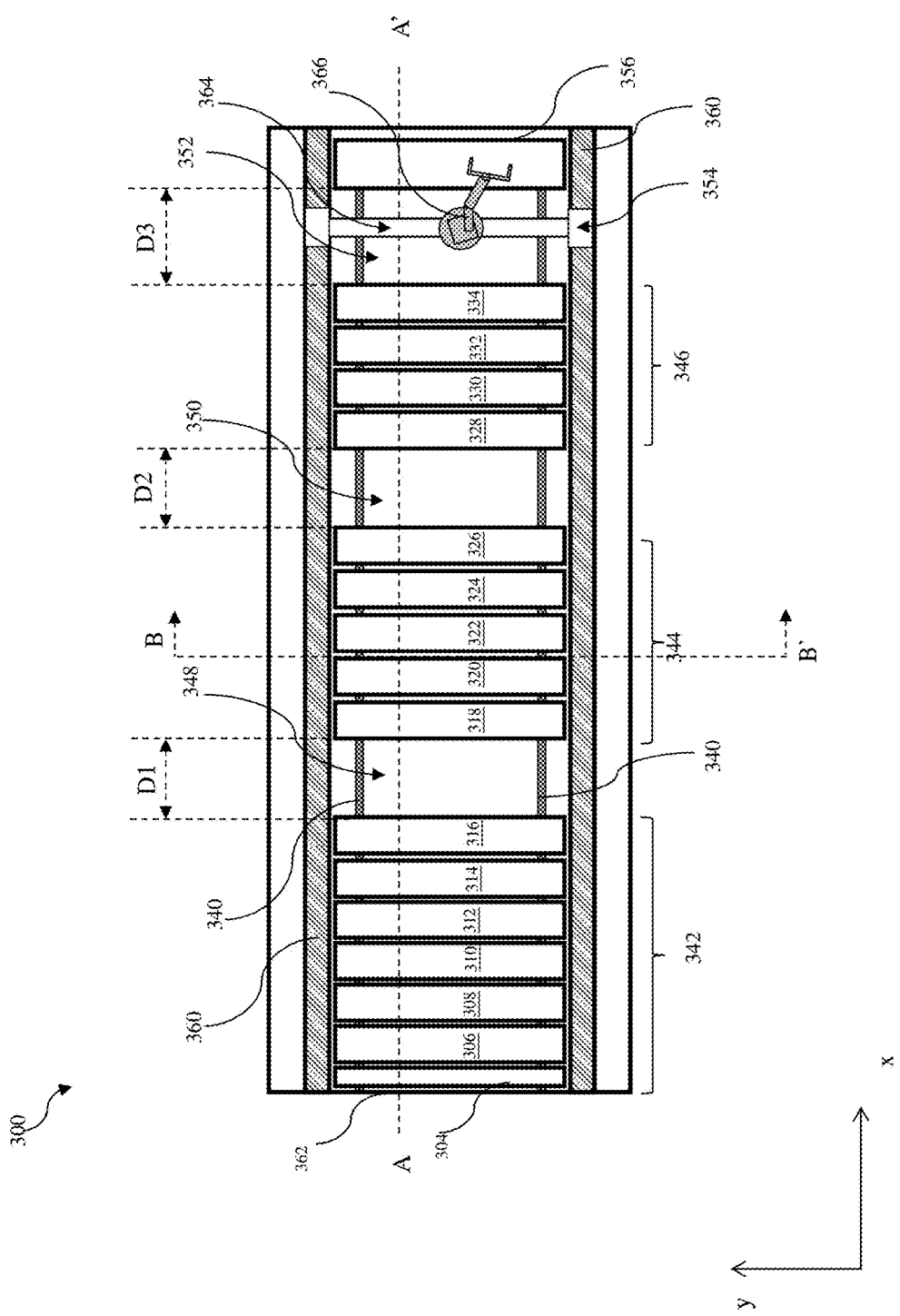
FIG. 18A is a top view of a mask storage system according to some embodiments.
Figure 18B:
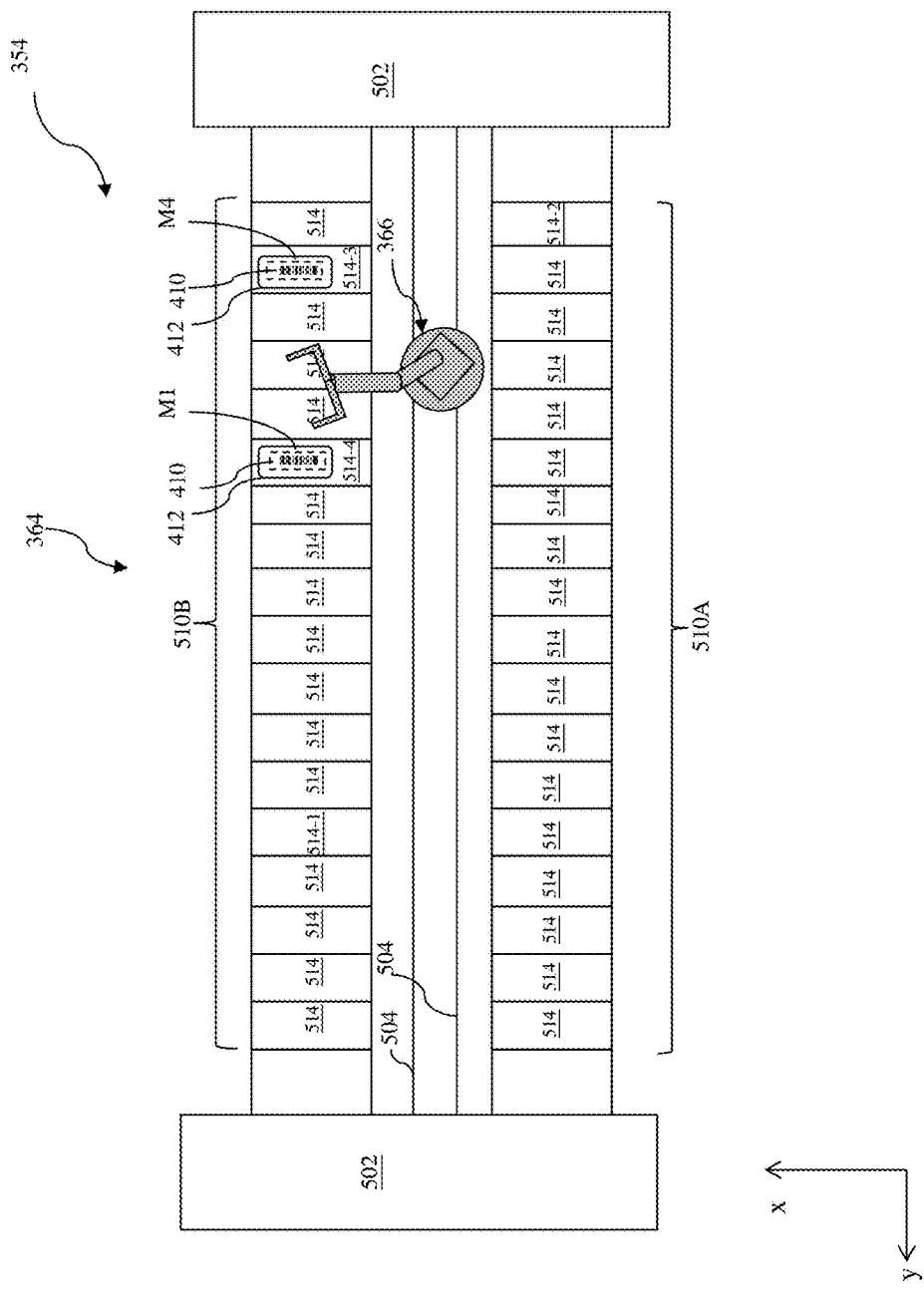
FIG. 18B is a top view of a gantry according to some embodiments.

Referring to FIGS. 7, 18A, and 18B, the method 700 proceeds to block 716, where the retrieved masks M1 and M4 are transferred from the mask buffer areas 510A and 510B of the gantry 354 to the loading port 356. Referring to the example of FIG. 18A, in some embodiments, after performing the last step 1302D of the access route 922, the mobile storage units are moved back to their initial positions (e.g., by moving mobile storage units 308, 310, 312, 314, and 316 back to be adjacent to the mobile storage units 306) according to the initial configuration discussed above with reference to FIGS. 2A and 2B. The gantry 354 is moved to a position adjacent to the load/upload port 356, so that the robotic arm 366 is in a position to reach the loading port 356.

Referring to the example of FIG. 18B, the robotic arm 366 moves the mask container 412 containing the mask M4 from the mask buffer cell 514-3 to a mask carrier (or a temporary storage area) in the loading port 356, and moves the mask container 412 containing the mask M1 from the mask buffer cell 514-3 to the mask carrier (or a temporary storage area) in the loading port 356.

Referring to FIG. 7, the method 700 proceeds to block 718, where the retrieved masks M1 and M4 are distributed to the tools requesting the masks using the manufacturing execution system 212, the transportation system 216, and the RTD system 214. In some embodiments, the loading port monitor 812 of the mask storage system controller 222 detects that mask containers containing masks M1 and M4 have been loaded to a mask carrier in the loading port 356, and notifies the manufacturing execution system 212 that the masks M1 and M4 requested by the mask retrieval requests 802 and 808 have been retrieved from the mask storage system 300.

In response to the notification, the manufacturing execution system 212 generates a request to move the mask carrier having the masks M1 and M4 from the loading port 356 of the mask storage system 300 to the lithography tool 204 and mask repair tool 210 respectively. Utilizing data from the manufacturing execution system 212 and the transportation system 216, the RTD system 214 determines a route for the mask carrier, for example, based on a set of RTD rules or using a route search engine. After receiving the route from the RTD system 214, the transportation system 216 (e.g., using an overhead transport system controlled by the overhead transport controller 226) executes the transfer of the mask carrier to the lithography tool 204 and mask repair tool 210 according to the route provided by the RTD system 214.

In some examples, the mask container containing the mask M1 is sent to the lithography tool 204, which performs a lithography process using the mask M1. In some examples, the mask M4 is sent to the mask repairing tool 210, which performs a mask repair process or a mask inspection process to the mask M4.

The embodiments of the present disclosure offer advantages over existing art, though it is understood that other embodiments may offer different advantages, not all advantages are necessarily discussed herein, and that no particular advantage is required for all embodiments. One of the advantages of some embodiments is that storage units can be controlled to move automatically to form an aisle for accessing a particular storage cell in a storage unit. By using a movable gantry to access the particular storage cell through the aisle, automated mask retrieval and storage is achieved. Another advantage of some embodiments is that the storage cells use sloped storage cells, which reduces the width of an individual storage unit and allows more storage units to be places in a limited space, thereby improving the density and reducing the cost of the mask storage system. Yet another advantage of some embodiments is that the movable gantry includes a mask buffer area, so that the mask storage system may handle a plurality of mask transfer requests in a single access route. By storing retrieved masks or masks to be stored in the mask buffer area, the movable gantry may not be required to return to a loading port for loading/unloading a mask for each of the plurality of mask transfer requests. Yet another advantage of some embodiments is that a mask storage system controller is used to automatically trace the locations of the masks in the mask storage system, update the storage cell status, and determine available storage cells for storing masks. Such mask storage system controller improves efficiency and accuracy of the mask management and reduces human error. Yet another advantage is that friendly human machine interfaces are provided by a mask storage system controller so that operators may conveniently monitor and manage various components (e.g., storage units, the gantry, the robotic arm, loading ports) of the mask storage system.

Thus, in one embodiment provided is an automated photomask storage and retrieval system including a plurality of mobile storage units aligned in a first direction. An automated photomask storage and retrieval system includes a plurality of mobile storage units aligned in a first direction. Each mobile storage unit is movable in the first direction and includes a plurality of storage cells. A gantry is disposed over the plurality of mobile storage units. The gantry includes a supporting frame movable in the first direction. The plurality of mobile storage units interpose a pair of supporting members of the supporting frame. A beam connects the pair of supporting members and is movable along the pair of supporting members in a second direction perpendicular to the first direction. The beam includes a plurality of buffer cells. A robotic arm is disposed adjacent to the plurality of buffer cells and movable along the beam. The robotic arm is configured to transfer a container containing a photomask between a storage cell and a buffer cell.

The present disclosure also provides a fabrication system including a tool configured operating with a mask and a mask storage system. The mask storage system includes a plurality of mobile storage units aligned in a first direction, where each mobile storage unit is movable in the first direction and includes a plurality of storage cells. A gantry is disposed over the plurality of mobile storage units and movable in the first direction. The gantry includes a buffer area including a plurality of buffer cells, a robotic arm for transferring a container containing the mask between a storage cell and a buffer cell, and a loading port for transferring the container between the mask storage system and a transportation system. The transportation system is configured to transfer the container between the loading port and the tool.

The present disclosure also provides an embodiment of a method includes providing a mask storage system including a plurality of mobile storage units movable in a first direction, a gantry movable in a first direction, and a loading port. A plurality of mask transfer requests for storing a first plurality of masks in the mask storage system and retrieving a second plurality of masks from the mask storage system are received. The first plurality of masks are transferred from the loading port to a buffer area in the gantry. Storage cells for the first plurality of masks and second plurality of masks are accessed. Accessing each storage cell includes providing an aisle for accessing a storage cell by moving the mobile storage units, moving the gantry to access the storage cell, and transferring a mask between the buffer area and the storage cell. The retrieved second plurality of masks are transferred from the buffer area to the loading port.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An automated photomask storage and retrieval system, comprising:
a plurality of mobile storage units aligned in a first direction, wherein each mobile storage unit is movable in the first direction and includes a plurality of storage cells;
a gantry disposed over the plurality of mobile storage units, wherein the gantry includes:
a supporting frame movable in the first direction, wherein the plurality of mobile storage units interpose a pair of supporting members of the supporting frame;
a beam connecting the pair of supporting members and movable along the pair of supporting members in a second direction perpendicular to the first direction, wherein the beam includes a plurality of buffer cells;
a robotic arm disposed adjacent to the plurality of buffer cells and movable along the beam, wherein the robotic arm is configured to transfer a container containing a photomask between a storage cell and a buffer cell.

2. The automated photomask storage and retrieval system of claim 1, where each mobile storage unit is double-sided.

3. The automated photomask storage and retrieval system of claim 1, wherein each storage cell has a barcode or radio-frequency identification (RFID) tag, and
wherein the robotic arm is configured to detect an identification of the storage cell by scanning the barcode or reading the RFID tag.

4. The automated photomask storage and retrieval system of claim 1, wherein the robotic arm is configured to detect an identification of the photomask stored in the container by scanning a barcode or radio-frequency identification (RFID) tag of the container.

5. The automated photomask storage and retrieval system of claim 1, wherein each storage cell includes a sloped bottom surface.

6. The automated photomask storage and retrieval system of claim 5, wherein the robotic arm includes a tilt compensation component adjusted based on an angle of the sloped bottom surface for reaching the storage cell.

7. The automated photomask storage and retrieval system of claim 1, wherein the plurality of mobile storage units include:
a first group of mobile storage units having initial locations disposed adjacent to each other; and
a second group of mobile storage units having initial locations disposed adjacent to each other;
wherein a space interposing a first end mobile storage unit of the first group of mobile storage units and a second end mobile storage unit of the second group of mobile storage units has a width greater than a width of the beam.

8. The automated photomask storage and retrieval system of claim 7, further comprising:
a loading port adjacent to an end of the plurality of the mobile storage units.

9. The automated photomask storage and retrieval system of claim 8, wherein a first distance between the first group of mobile storage units and the loading port is greater than a second distance between the second group of mobile storage units and the loading port,
wherein the first group of mobile storage units are configured to store containers containing masks with a first usage frequency, and
wherein the second group of mobile storage units are configured to store containers containing masks with a second usage frequency greater than the first usage frequency.

10. The automated photomask storage and retrieval system of claim 9, wherein the first group of mobile storage units includes a first number of mobile storage units, and
wherein the second group of mobile storage units includes a second number of mobile storage units, wherein the second number is less than the first number.

11. The automated photomask storage and retrieval system of claim 1, further comprising:
a loading port adjacent to an end of the plurality of the mobile storage units for transferring the container to a transportation system, wherein the transportation system is configured to transfer the container between the loading port and a tool for operating a mask.

12. The automated photomask storage and retrieval system of claim 11, wherein the tool is one of a lithography tool and a mask repair tool.

13. The automated photomask storage and retrieval system of claim 11, wherein the transportation system is an overhead hoist transportation system.

14. A method, comprising:
providing a mask storage system including a plurality of mobile storage units movable in a first direction, a gantry movable in a first direction, and a loading port;
receiving a plurality of mask transfer requests for storing a first plurality of masks in the mask storage system and retrieving a second plurality of masks from the mask storage system;
transferring the first plurality of masks from the loading port to a buffer area in the gantry;
accessing storage cells for the first plurality of masks and second plurality of masks, wherein accessing each storage cell includes:
providing an aisle for accessing a storage cell by moving the mobile storage units;
moving the gantry to access the storage cell; and
transferring a mask between the buffer area and the storage cell; and
transferring the retrieved second plurality of masks from the buffer area to the loading port.

15. The method of claim 14, further comprising:
transferring the retrieved second plurality of masks between the loading port and a plurality of tools.

16. The method of claim 14, wherein the moving the gantry to access the storage cell includes:
moving a pair of supporting members of the gantry in the first direction to the aisle;
moving a beam of the gantry along the pair of supporting members in a second direction perpendicular to the first direction to a height determined based on a height of the storage cell; and
moving a robotic arm along the beam so that the storage cell is reachable by the robotic arm.

17. The method of claim 16, wherein the accessing storage cells includes:
accessing the storage cells according to a route determining based on a route distance, wherein the route distance includes one selected from a group consisting of a travel distance of the mobile storage units in the first direction, a travel distance of the pair of supporting members of the gantry in the first direction, a travel distance of the beam in the second direction, a travel distance of the robotic arm along the beam, and a combination thereof.

18. A method, comprising:
- providing a mask storage system including a plurality of mobile storage units movable in a first direction, a gantry movable in a first direction, and a loading port;
- receiving a plurality of mask transfer requests for storing a first plurality of masks in the mask storage system and retrieving a second plurality of masks from the mask storage system;
- transferring the first plurality of masks from the loading port to a buffer area in the gantry;
- accessing storage cells for the first plurality of masks and second plurality of masks, wherein accessing each storage cell includes:
  - providing an aisle for accessing a storage cell by moving the mobile storage units;
  - moving the gantry to access the storage cell; and
  - transferring, using a robotic arm, a mask between the buffer area and the storage cell; and
- transferring the retrieved second plurality of masks from the buffer area to the loading port.

19. The method of claim 18, further comprising:
- determining an angle of a sloped bottom surface of the storage cell; and
- adjusting a tilt compensation component of the robotic arm based on the angle of the sloped bottom surface for reaching the storage cell.

20. The method of claim 18, further comprising:
- transferring the retrieved second plurality of masks from the loading port to a plurality of tools for operating a mask.

* * * * *